(12) United States Patent
Nozawa et al.

(10) Patent No.: US 11,226,549 B2
(45) Date of Patent: *Jan. 18, 2022

(54) MASK BLANK, PHASE SHIFT MASK, METHOD FOR MANUFACTURING THEREOF, AND METHOD FOR MANUFACTURING SEMICONDUCTOR DEVICE

(71) Applicant: HOYA CORPORATION, Tokyo (JP)

(72) Inventors: Osamu Nozawa, Tokyo (JP); Hiroaki Shishido, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 118 days.

This patent is subject to a terminal disclaimer.

(21) Appl. No.: 15/754,927

(22) PCT Filed: Jun. 20, 2016

(86) PCT No.: PCT/JP2016/068250
§ 371 (c)(1),
(2) Date: Feb. 23, 2018

(87) PCT Pub. No.: WO2017/038213
PCT Pub. Date: Mar. 9, 2017

(65) Prior Publication Data
US 2020/0064726 A1    Feb. 27, 2020

(30) Foreign Application Priority Data
Aug. 31, 2015  (JP) .................................. 2015-170547

(51) Int. Cl.
*G03F 1/26*         (2012.01)
*G03F 1/48*         (2012.01)
(Continued)

(52) U.S. Cl.
CPC .................. *G03F 1/26* (2013.01); *G03F 1/48* (2013.01); *G03F 1/80* (2013.01); *G03F 1/84* (2013.01); *H01L 21/0274* (2013.01)

(58) Field of Classification Search
CPC ..... G03F 1/84; G03F 1/26; G03F 1/48; G03F 1/80; G03F 1/30
See application file for complete search history.

(56) References Cited

U.S. PATENT DOCUMENTS 5,322,748 A * 6/1994 Watakabe .................. G03F 1/29
  216/48
5,323,208 A * 6/1994 Fukuda ............... G03F 7/70308
  355/53

(Continued)

FOREIGN PATENT DOCUMENTS

CN    102820386 A    12/2012
JP    4-233541 A      8/1992
(Continued)

OTHER PUBLICATIONS

Machine translation of JP 2005-208660 (2005).*

(Continued)

*Primary Examiner* — Martin J Angebranndt
(74) *Attorney, Agent, or Firm* — Kilpatrick Townsend & Stockton LLP

(57) ABSTRACT

Provided is a mask blank for a phase shift mask having an etching stopper film, which satisfies the characteristics: higher durability to dry etching with fluorine-based gas that is used during the shift pattern formation as compared to that of a transparent substrate; high resistance to chemical cleaning; and high transmittance of exposure light.

The mask blank includes a light shielding film on a main surface of a transparent substrate, having a structure where an etching stopper film, a phase shift film, and a light shielding film are laminated in this order on the transparent (Continued)

substrate; wherein the phase shift film includes a material containing silicon and oxygen; and the etching stopper film includes a material containing silicon, aluminum, and oxygen.

21 Claims, 14 Drawing Sheets

(51) Int. Cl.
 *G03F 1/80* (2012.01)
 *G03F 1/84* (2012.01)
 *H01L 21/027* (2006.01)

(56) References Cited

U.S. PATENT DOCUMENTS

| | | | |
|---|---|---|---|
| 5,380,608 A * | 1/1995 | Miyashita | G03F 1/29 430/311 |
| 5,405,721 A * | 4/1995 | Pierrat | G03F 1/26 430/5 |
| 5,582,939 A * | 12/1996 | Pierrat | G03F 1/30 216/47 |
| 5,876,877 A | 3/1999 | Hanyu et al. | |
| 6,743,553 B2 | 6/2004 | Shiota et al. | |
| 7,115,341 B2 | 10/2006 | Shiota et al. | |
| 7,771,894 B2 * | 8/2010 | Wu | G03F 1/80 430/311 |
| 9,229,317 B2 * | 1/2016 | Nam | G03F 1/24 |
| 10,481,485 B2 * | 11/2019 | Nozawa | G03F 1/74 |
| 2003/0047691 A1 | 3/2003 | Musil et al. | |
| 2003/0180630 A1 | 9/2003 | Shiota et al. | |
| 2005/0019674 A1 * | 1/2005 | Okubo | G03F 1/80 430/5 |
| 2005/0190450 A1 | 9/2005 | Becker et al. | |
| 2006/0292454 A1 * | 12/2006 | Suda | G03F 1/29 430/5 |
| 2007/0187875 A1 * | 8/2007 | Terasaki | B82Y 10/00 264/496 |
| 2010/0097592 A1 * | 4/2010 | Kraehmer | G03F 7/70341 355/67 |
| 2012/0100466 A1 | 4/2012 | Hashimoto et al. | |
| 2013/0171810 A1 | 7/2013 | Sun et al. | |
| 2014/0071552 A1 * | 3/2014 | Uchiyama | G02B 1/118 359/885 |
| 2015/0198873 A1 | 7/2015 | Okubo et al. | |
| 2018/0259841 A1 * | 9/2018 | Nozawa | G03F 1/54 |

FOREIGN PATENT DOCUMENTS

| | | |
|---|---|---|
| JP | 6-167802 A | 6/1994 |
| JP | H06-347993 | 12/1994 |
| JP | 9-160218 A | 6/1997 |
| JP | 2002-251000 A | 9/2002 |
| JP | 2004-004791 | 1/2004 |
| JP | 2004-537758 A | 12/2004 |
| JP | 2005-208660 * | 8/2005 |
| JP | 2005-208660 A | 8/2005 |
| JP | 2006-84507 A | 3/2006 |
| JP | 2007-271720 A | 10/2007 |
| JP | 2014-059575 | 4/2014 |
| JP | 201459575 A | 4/2014 |
| JP | 2014-211502 A | 11/2014 |
| KR | 10-2013-0078222 | 7/2013 |
| KR | 10-2015-0034766 | 4/2015 |
| TW | 544549 | 8/2003 |
| WO | 2016/185941 * | 11/2016 ............ G03F 1/48 |

OTHER PUBLICATIONS

Dragic et al., "The linear and non-linear refractive indices of amorphous Al2O3 deduced form aluminosilicate fibers", Int. J. Appl. Glass Sci., vol. 9 pp. 421-427 (2018).*
Lai et al. "ArF-line high transmittance attenuated phase shift mask blanks using amorphous Al2O3—ZrO2—SiO2 composite thin films for the 65-, 54- and 32-nm technology nodes", Thin Sol. Films, vol. 496 pp. 247-252 (2006).*
Communication dated May 18, 2018, from the Taiwan Patent Office in counterpart Application No. 105119788.
International Search Report for PCT/JP2016/068250 dated Jul. 19, 2016 [PCT/ISA/210].
KR10-2018-7001582, "Notification of Reasons for Refusal" dated Dec. 5, 2019, with machine translation.

* cited by examiner

MASK BLANK, PHASE SHIFT MASK, METHOD FOR MANUFACTURING THEREOF, AND METHOD FOR MANUFACTURING SEMICONDUCTOR DEVICE

CROSS REFERENCE TO RELATED APPLICATIONS

This application is a National Stage of International Application No. PCT/JP2016/068250, filed on Jun. 20, 2016, which claims priority from Japanese Patent Application No. 2015-170547, filed on Aug. 31, 2015.

TECHNICAL FIELD

The present invention relates to a mask blank, a phase shift mask manufactured using the mask blank, and a method for manufacturing the same. Furthermore, the present invention relates to a method for manufacturing a semiconductor device using the phase shift mask.

BACKGROUND ART

Generally, in the manufacturing steps of semiconductor devices, fine patterns are formed using the photolithography method. Formation of this pattern normally uses a plurality of transfer masks, and when a fine pattern is formed, a phase shift mask is frequently used in which the transfer performance such as the resolution is increased by using a phase shift. Furthermore, to make patterns in a semiconductor device finer, it is necessary not only to enhance and improve the transfer mask typified by a phase shift mask, but also to shorten the wavelength of the exposure light source used in photolithography. Therefore, regarding the exposure light sources used in the manufacture of semiconductor devices, a shift to shorter wavelengths is observed in recent years from the KrF excimer laser (wavelength of 248 nm) to the ArF excimer laser (wavelength of 193 nm).

A digging Levenson type phase shift mask, which is one type of phase shift mask, includes a light transmitting part containing a dug part and a non-dug part formed in a transparent substrate, and a light shielding part where a pattern such as a line and space pattern is formed. Specifically, a light shielding part is formed in a region where a light shielding film is provided on a transparent substrate, and the light transmitting part is formed in a region where a light shielding film is not provided and the transparent substrate is exposed. The digging depth of the dug part is a depth that can provide a predetermined phase difference where a phase shift effect is obtained between exposure light that passes through the dug part and the exposure light that passes through the non-dug part. Conventionally, a digging Levenson type phase shift mask is manufactured by a process that uses a mask blank with a light shielding film made of a chromium-based material on a transparent substrate as disclosed in Patent Literature 1, for example.

On the other hand, Patent Literature 2 discloses a method of manufacturing a Levenson type phase shift mask that uses a laminated film. With this method, a transparent conductive film made of alumina ($Al_2O_3$) with an etching stopper function, a transparent phase shift film made of $SiO_2$, and a light shielding film mainly made of Cr are formed in this order on a transparent substrate made of quartz, a pattern with a main light transmitting part and an auxiliary light transmitting part is formed on the light shielding film, and then a pattern of the auxiliary light transmitting part is formed on the phase shift film.

Defects in transfer masks such as phase shift masks directly lead to defects in semiconductor devices manufactured using this transfer mask and a reduction in yield. Therefore, when defects are found in the transfer mask, mask defect repair is performed. As mask defect repair technology, Patent Literature 3 discloses a defect repair technology according to which black defect portions are etched and removed by irradiating the black defect portions of the light shielding film with an electron beam while xenon difluoride ($XeF_2$) gas is supplied thereto (hereinafter, defect repair performed by irradiation of charged particles such as electron beams is simply referred to as EB defect repair). While this EB defect repair was used initially for the repair of black defects in the absorber film of reflective masks for EUV lithography (Extreme Ultraviolet Lithography), it has also come to be used for the defect repair in phase shift masks in recent years.

CITATION LIST

Patent Literature

Patent Literature 1: Japanese Patent Application Publication 09-160218
Patent Literature 2: Japanese Patent Application Publication 2006-084507
Patent Literature 3: PCT Application Japanese Translation Publication 2004-537758

SUMMARY OF INVENTION

Technical Problem

A conventional digging Levenson type phase shift mask has a structure where a dug part and a non-dug part are formed on a substrate, and a phase shift effect is generated between the exposure light that is transmitted through the dug part and the exposure light that is transmitted through the non-dug part. The phase difference between the exposure light transmitted through the dug part and the exposure light transmitted through the non-dug part is caused by the difference in the distance that the exposure light is transmitted through the substrate. With a digging Levenson type phase shift mask, ideally there is no difference in the phase shift effect that occurs between various regions on the surface of the phase shift mask. Therefore, with a digging Levenson type phase shift mask, ideally the depths of each dug part on the surface of the phase shift mask are equal. Each dug part of the phase shift mask is formed simultaneously by performing dry etching on the substrate. The bottom surface shape and depth of the pattern of the dug parts in the phase shift mask are affected by a micro-trench phenomenon and a micro-loading phenomenon, and the like, and therefore it is difficult to control the shape and depth of the bottom surface of the dug parts to be equal using dry etching. In recent years, the pattern width of the dug part has become finer in conjunction with mask patterns becoming finer, and controlling the depth of the dug parts has become difficult. On the other hand, in conjunction with finer patterning, there is demand for higher phase control for optical reasons, and in other words, there is demand for higher control of the depth of the dug parts.

Incidentally, the micro-trench phenomenon is a phenomenon where a fine ditch is formed by deep digging near a pattern edge part. Furthermore, the micro-loading phenomenon is a phenomenon where the etched depth varies depending on the width of an opening part of a pattern, when using an fine pattern.

The phase shift mask disclosed in Patent Literature 2 is configured such that a phase shift effect occurs between the exposure light that is transmitted through an auxiliary light transmitting part where a pattern is formed on a transparent phase shift film made of $SiO_2$ and the exposure light transmitted through the main light-transmitting part where the pattern is not formed in the phase shift film. In other words, the phase shift mask disclosed in Patent Literature 2 generates the same high phase shift effect when a dug part is formed as the phase shift pattern in the phase shift film made of $SiO_2$, instead of the dug part of a conventional digging Levenson type phase shift mask. Furthermore, the phase shift mask of Patent Literature 2 has a transparent conductive film (etching stopper film) made of $Al_2O_3$ between the transparent substrate and the phase shift film made of $SiO_2$. The etching stopper film made of $Al_2O_3$ has higher durability to dry etching performed by a fluorine-based gas when a pattern is formed on the phase shift film made of $SiO_2$. Therefore, the digging of the substrate can be controlled when a pattern is formed on the phase shift film made of $SiO_2$, phase control is enhanced, and the difference in the phase shift effect on the surface of the phase shift mask can be reduced.

However, etching stopper films made of $Al_2O_3$ tend to have low resistance to chemical cleaning. During the process of manufacturing phase shift masks from mask blanks, cleaning by chemicals is performed many times on the mask blank. Furthermore, cleaning by chemicals is periodically performed for finished phase shift masks as well. With such cleaning, an ammonia-hydrogen peroxide or TMAH (tetramethyl ammonium hydroxide) aqueous solution is frequently used as a cleaning solution, but etching stopper films made of $Al_2O_3$ have low resistance to these cleaning solutions.

For example, cleaning is performed using ammonia-hydrogen peroxide on a phase shift mask that includes an etching stopper film made of $Al_2O_3$ and a phase shift film with a phase shift pattern on a transparent substrate made of glass. At this time, the etching stopper film gradually dissolves from the surface in the light transmitting parts where the surface of the etching stopper film is exposed in the phase shift mask, and the main surface of the substrate becomes exposed in the light transmitting part as dissolution proceeds. Then, in a case where further cleaning is performed, the etching stopper film directly under patterned portions where the phase shift film exists will also dissolve from the side wall side of the phase shift film toward the inside. Since this phenomenon involving the dissolution of the etching stopper film proceeds from both side wall sides of the pattern in the phase shift film, the width of the etching stopper film that remains without dissolving will be smaller than the pattern width of the phase shift film. When such a state is reached, a phenomenon of dropping patterns in the phase shift film is prone to occur.

Furthermore, when a phase shift mask is placed in the exposure apparatus and transferred by exposure to a transfer target (such as a resist film on a semiconductor wafer), exposure light enters from the side of the main surface that is opposite the main surface of the transparent substrate of the phase shift mask on which a phase shift pattern is provided. The exposure light that has entered the transparent substrate is emitted to the atmosphere through the etching stopper film in the dug part, and is emitted to the atmosphere through the etching stopper film and the phase shift film in the non-dug part. The optical properties and thickness of the phase shift film of the phase shift mask are designed on the premise that the exposure light that passes through the dug part and exposure light that passes through the non-dug part both pass through the etching stopper film. However, in a case where the etching stopper film of the non-dug part is made thinner or is eliminated by the aforementioned cleaning of the phase shift mask, the phase difference between the exposure light that passes through the dug part and the exposure light that passes through the non-dug part will not be as designed, and there is a possibility that the intended phase shift effect will not be achieved.

Furthermore, etching stopper films made of $Al_2O_3$ suffer from lower transmittance with respect to exposure light than synthetic quartz glass used as the material for transparent substrates of phase shift masks. In the case of phase shift masks in which the ArF excimer laser (wavelength 193 nm) is applied to exposure light, this tendency presents itself more conspicuously. Etching stopper film made of $Al_2O_3$ will remain in both the dug part and the non-dug part of the light transmitting part when the phase shift mask is completed. A reduction in the transmittance of the exposure light in the light transmitting part of the phase shift mask leads to a reduction in the integrated irradiation amount of exposure light to the transfer object per unit time. Therefore, the exposure time needs to be increased, which leads to a reduction in the throughput of the exposure light transfer step when manufacturing a semiconductor device.

The present invention resolves the aforementioned conventional problems. In other words, an object of the present invention is to provide a mask blank for a phase shift mask including a thin film for pattern formation, such as a phase shift film or light shielding film, on a transparent substrate and configured with an etching stopper film interposed between the transparent substrate and the thin film for pattern formation, that has high durability to the dry etching with a fluorine-based gas used for patterning thin films for pattern formation, high resistance to chemical cleaning, and high transmittance of exposure light. Furthermore, an object of the prevent invention is to provide a phase shift mask manufactured using such a mask blank. In addition, an object of the present invention is to provide a method for manufacturing such a phase shift mask. Also, an object of the present invention is to provide a method for manufacturing a semiconductor device using such a phase shift mask.

Means for Solving Problem

In order to solve the aforementioned problems, the present invention has the following configuration.
(Configuration 1)
A mask blank including a light shielding film on a main surface of a transparent substrate, the mask blank including:
a structure including an etching stopper film, a phase shift film, and the light shielding film laminated in this order on the transparent substrate;
wherein the phase shift film is made of a material containing silicon and oxygen; and the etching stopper film is made of a material containing silicon, aluminum, and oxygen.
(Configuration 2)
The mask blank according to configuration 1, wherein an oxygen content of the etching stopper film is 60 atom % or more.
(Configuration 3)
The mask blank according to configuration 1 or 2, wherein a ratio of a content of the silicon to a total content of the silicon and the aluminum in the etching stopper film is 4/5 or less in terms of atom %.

(Configuration 4)

The mask blank according to any one of configurations 1 to 3, wherein the etching stopper film is made of silicon, aluminum, and oxygen.

(Configuration 5)

The mask blank according to any one of configurations 1 to 4, wherein the etching stopper film is formed in contact with the main surface of the transparent substrate.

(Configuration 6)

The mask blank according to any one of configurations 1 to 5, wherein the thickness of the etching stopper film is 3 nm or more.

(Configuration 7)

The mask blank according to any one of configurations 1 to 6, wherein the phase shift film has a structure including a lower layer made of a material containing silicon and oxygen and an upper layer made of a material containing silicon, aluminum, and oxygen laminated in this order.

(Configuration 8)

The mask blank according to any one of configurations 1 to 7, wherein the phase shift film has a function of generating a phase difference of 150 degrees or more and 200 degrees or less to the exposure light transmitted through the phase shift film as compared to the exposure light that passes through air for a distance identical to a thickness of the phase shift film.

(Configuration 9)

The mask blank according to any one of configurations 1 to 8, wherein the phase shift film functions to transmit exposure light at a transmittance of 95% or more.

(Configuration 10)

The mask blank according to any one of configurations 1 to 9, wherein the light shielding film is made of a material containing chromium.

(Configuration 11)

The mask blank according to any one of configurations 1 to 9, wherein the light shielding film is made of a material containing at least one element selected from silicon and tantalum.

(Configuration 12)

The mask blank according to configuration 10, wherein a hard mask film made of a material containing at least one element selected from silicon and tantalum is provided on the light shielding film.

(Configuration 13)

The mask blank according to configuration 11, wherein a hard mask film made of a material containing chromium is provided on the light shielding film.

(Configuration 14)

A phase shift mask including the phase shift film of the mask blank according to any one of configurations 1 to 11 having a phase shift pattern, and the light shielding film having a light shielding pattern.

(Configuration 15)

A method for manufacturing a phase shift mask using the mask blank according to any one of configurations 1 to 6, including the steps of:

forming a phase shift pattern on the light shielding film by dry etching;

forming a phase shift pattern on the phase shift film by dry etching with a fluorine-based gas, using the light shielding film having the phase shift pattern as a mask; and forming a light shielding pattern including a light shielding band on the light shielding film by dry etching.

(Configuration 16)

A method for manufacturing a semiconductor device, comprising a step of transferring by exposure a pattern on a phase shift mask to a resist film on a semiconductor substrate using the phase shift mask according to configuration 14.

(Configuration 17)

A method for manufacturing a semiconductor device, comprising a step of transferring by exposure a pattern on a phase shift mask to a resist film on a semiconductor substrate using a phase shift mask manufactured by the method for manufacturing a phase shift mask according to configuration 15.

Effects of Invention

The mask blank of the present invention is a mask blank for a phase shift mask including a light shielding film on a main surface of a transparent substrate, including an etching stopper film and a phase shift film laminated in this order between the transparent substrate and the light shielding film; wherein the phase shift film contains silicon and oxygen; and the etching stopper film contains silicon, aluminum, and oxygen. By configuring the mask blank in this way, the etching stopper film can simultaneously satisfy the following three characteristics: having an etching stopper function with sufficiently high durability for practical use toward dry etching with a fluorine-based gas, which is performed when forming a pattern on a phase shift mask; high resistance to chemical cleaning; and high transmittance of exposure light.

DESCRIPTION OF EMBODIMENTS

Figure 1:
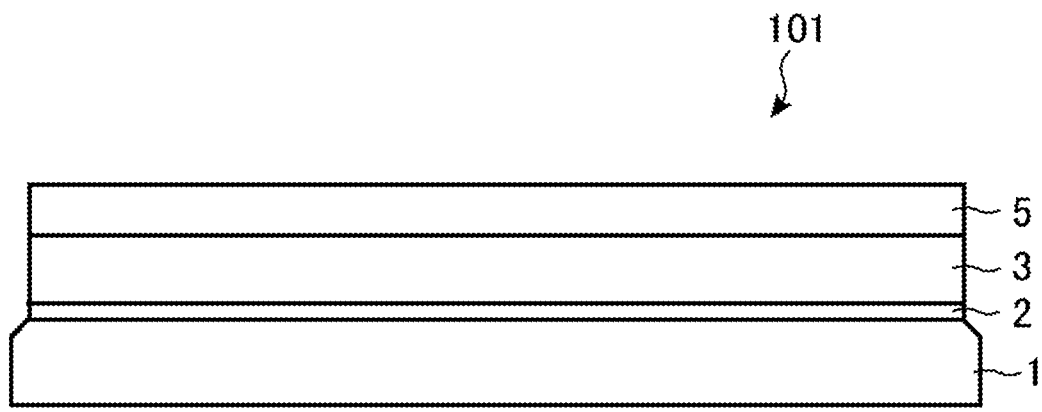
FIG. 1 is a cross-sectional view illustrating a configuration of a mask blank according to a first embodiment and a second embodiment of the present invention.

First, the circumstances leading to the completion of the present invention will be described. The present inventors engaged in diligent research to solve the technical problems of the etching stopper films made of $Al_2O_3$. As the material for etching stopper films, while $Al_2O_3$ has high durability to dry etching with a fluorine-based gas, it does not have very high transmittance with respect to exposure light of the ArF excimer laser (wavelength: approximately 193 nm) as shown by Comparative Example 1 described below, and has low resistance to cleaning solutions used for cleaning phase shift masks. On the other hand, as the main material for transparent substrates, while $SiO_2$ is a material that has high transmittance with respect to exposure light of the ArF excimer laser and high resistance to cleaning solutions used for cleaning phase shift masks, it is also a material that is prone to etching by dry etching with a fluorine-based gas. Furthermore, as a result of diligent study, the present inventors discovered the possibility of simultaneously satisfying the three characteristics of durability to dry etching with a fluorine-based gas, high transmittance with respect to exposure light of the ArF excimer laser (wavelength: approximately 193 nm), and high resistance to cleaning solutions used in cleaning phase shift masks, by forming an etching stopper film from a material combining $Al_2O_3$ and $SiO_2$.

When verification was performed using an etching stopper film made of materials combining $Al_2O_3$ and $SiO_2$, it was revealed that sufficient durability to dry etching with a fluorine-based gas was provided for practical use, and these films have sufficient function as an etching stopper film. Furthermore, for transmittance with respect to exposure light of the ArF excimer laser, it was revealed that the transmittance was remarkably higher than that of an etching stopper film made of only $Al_2O_3$, and that practical use could be withstood. In addition, it was also revealed that the resistance to cleaning solutions (such as ammonia-hydrogen peroxide and TMAH) was remarkably higher than materials made only of $Al_2O_3$, and there was no problem for practical use. Furthermore, when a process of irradiating a portion with an electron beam while supplying xenon difluoride ($XeF_2$) gas thereto, which is performed in EB defect repair, was performed with respect to the etching stopper film using a material combining $Al_2O_3$ and $SiO_2$, the resistance was sufficiently high compared to the case when using material made only of $SiO_2$. This indicates that there is a possibility that EB defect repair can be performed on the dug part which was difficult with a conventional digging Levenson type phase shift mask.

As a result of diligent study of the foregoing, a conclusion is reached that in order to solve the technical problems facing etching stopper films made of $Al_2O_3$, it is necessary to form an etching stopper film from a material that contains silicon, aluminum, and oxygen. In other words, the mask blank of the present invention is a mask blank for a phase shift mask having a phase shift film and a light shielding film on a main surface of a transparent substrate, where the phase shift film contains silicon and oxygen, and an etching stopper film is provided between the transparent substrate and the phase shift film, and the etching stopper film contains silicon, aluminum, and oxygen. Next, each embodiment of the present invention will be described.

First Embodiment

[Mask Blank and the Manufacture Thereof]

Various embodiments are described below while referring to the drawings. Note that the identical reference symbols will be used for same components in the embodiments, and duplicate descriptions of such components will be simplified or omitted.

The mask blank according to the first embodiment of the present invention is a mask blank that is used for manufacturing a Levenson type phase shift mask. The Levenson type phase shift mask has a structure where a predetermined phase difference (generally a phase difference of approximately 180 degrees) occurs between two types of exposure light that pass through two types of light emitting parts with a light shielding pattern that absorbs exposure light interposed therebetween. By providing this structure, diffracted light is canceled out by the interference that occurs between the two types of exposure light that pass through the two light transmitting parts, and resolution of the pattern is highly increased (this is referred to as a phase shift effect). Furthermore, with a Levenson type phase shift mask, the phase shift effect is enhanced between the two light transmitting parts where the exposure light does not pass through due to the light shielding pattern, and therefore the light shielding pattern is generally formed from a light shielding film with high light-shielding performance, similar to a binary mask.

FIG. 1 illustrates the configuration of the mask blank of this first embodiment. The mask blank 101 according to the first embodiment includes etching stopper film 2, phase shift film 3, and light shielding film 5 on the main surface of the transparent substrate 1.

The transparent substrate 1 is not particularly limited as long as it has high transmittance with respect to exposure light and has sufficient rigidity. In the present invention, synthetic quartz glass substrates and other types of glass substrates (such as, for example, soda-lime glass and aluminosilicate glass) can be used. Among these substrates, synthetic quartz glass substrates are particularly suitable for substrates of the mask blank of the present invention used in forming high-definition transfer patterns, because they have high transmittance in the ArF excimer laser light (wavelength 193 nm) and shorter wavelength regions. Note, however, that all these glass substrates are materials that are prone to being etched by dry etching with a fluorine-based gas. For this reason, it is important to provide the etching stopper film 2 on the transparent substrate 1.

Etching stopper film 2 is formed from materials that contain silicon, aluminum, and oxygen. This etching stopper film 2 remains across the entire surface of the transfer pattern formation region without being removed at the stage in which the phase shift mask 201 is completed (see FIG. 2). In other words, the etching stopper film 2 also remains in light transmissive portions, which are regions without the phase shift pattern 3c. For this reason, etching stopper film 2 is preferably formed in contact with transparent substrate 1 with no other film interposed between etching stopper film 2 and transparent substrate 1.

The higher the transmittance with respect to exposure light, the more suitable etching stopper film 2 is. However, since sufficient etching selectivity between transparent substrate 1 and etching stopper film 2 in fluorine-based gas is required at the same time, it is difficult to make the transmittance of etching stopper film 2 with respect to exposure light the same as that of transparent substrate 1. In other words, the transmittance of the etching stopper film 2 will be less than 100%, assuming that the transmittance of transparent substrate 1 (synthetic quartz glass) to exposure light is 100%. Assuming the transmittance of the transparent substrate 1 with respect to exposure light is 100%, the transmittance of the etching stopper film 2 is preferably 95% or more, more preferably 96% or more, and even more preferably 97% or more.

The etching stopper film 2 preferably has an oxygen content of 60 atom % or more. This is because in order to have a transmittance to exposure light that is no less than the aforementioned value, etching stopper film 2 needs to contain a large amount of oxygen. Furthermore, silicon bound to oxygen tends to have higher resistance to chemical cleaning (in particular, alkaline cleaning with ammonia-hydrogen peroxide, TMAH, etc.) than silicon not bound to oxygen, therefore it is preferable to increase the ratio of silicon bound to oxygen with regard to all of the silicon existing in the etching stopper film 2. On the other hand, the etching stopper film 2 preferably has an oxygen content of 66 atom % or less.

For etching stopper film 2, the ratio of the silicon (Si) content [atom %] to the total content [atom %] of silicon (Si) and aluminum (Al) (hereinafter, referred to as the ratio Si/[Si+Al]) is preferably 4/5 or less. By making the ratio Si/[Si+Al] of etching stopper film 2 to be 4/5 or less, the etching rate of etching stopper film 2 in dry etching with a fluorine-based gas can be 1/3 or less of the etching rate of transparent substrate 1. In other words, etching selectivity of 3 times or more can be achieved between the transparent substrate 1 and the etching stopper film 2. Furthermore, the ratio Si/[Si+Al] in etching stopper film 2 is more preferably 3/4 or less, and even more preferably 2/3 or less. When the ratio Si/[Si+Al] is 2/3 or less, the etching rate of etching stopper film 2 in dry etching with a fluorine-based gas can be 1/5 or less than the etching rate of the transparent substrate 1. In other words, etching selectivity of 5 times or more can be achieved between the transparent substrate 1 and the etching stopper film 2.

For etching stopper film 2, the ratio Si/[Si+Al] of silicon (Si) and aluminum (Al) is preferably 1/5 or more. By making the ratio Si/[Si+Al] of etching stopper film 2 to be 1/5 or more, the transmittance of etching stopper film 2 can be 95% or more, assuming the transmittance of transparent substrate 1 (synthetic quartz glass) to exposure light is 100%. Furthermore, resistance to chemical cleaning can be simultaneously increased. Furthermore, the ratio Si/[Si+Al] in etching stopper film 2 is preferably 1/3 or more. In a case where the ratio Si/[Si+Al] is 1/3 or more, the transmittance of etching stopper film 2 can be 97% or more, assuming the transmittance of transparent substrate 1 (synthetic quartz glass) with respect to exposure light is 100%.

For etching stopper film 2, the content of metals other than aluminum is preferably 2 atom % or less, more preferably 1 atom % or less, and even more preferably at the lowest detection limit or less as determined by composition analysis using X-ray photoelectron spectroscopy. This is because the presence of a metal other than aluminum in etching stopper film 2 serves as a factor decreasing transmittance to exposure light. Furthermore, for etching stopper film 2, the total content of elements other than silicon, aluminum, and oxygen is preferably 5 atom % or less, and more preferably 3 atom % or less.

Etching stopper film 2 is preferably formed using a material made of silicon, aluminum, and oxygen. A material made of silicon, aluminum, and oxygen means a material that only contains, in addition to the above constituent elements, those elements that come to be unavoidably contained in etching stopper film 2 when forming the film by the sputtering method (including rare gases such as helium (He), neon (Ne), argon (Ar), krypton (Kr), and xenon (Xe), hydrogen (H), and carbon (C)). Minimizing the presence of other elements that may bond with silicon or aluminum in etching stopper film 2 can significantly increase the ratio of the bonds between silicon and oxygen and the bonds between aluminum and oxygen in etching stopper film 2. Therefore, the total amount of the unavoidable elements (rare gases, hydrogen, carbon, and the like) that are included in the etching stopper film 2 is preferably 3 atom % or less. Thus, higher etching durability to dry etching with a fluorine-based gas, higher resistance to chemical cleaning, and higher transmittance with respect to exposure light can be achieved. Etching stopper film 2 preferably has an amorphous structure. More specifically, etching stopper film 2 preferably has an amorphous structure including a bond of silicon and oxygen and a bond of aluminum and oxygen. Thereby, transmittance to exposure light can be increased while the surface roughness of the etching stopper film 2 can be improved.

Etching stopper film 2 preferably has a thickness of 3 nm or more. While forming etching stopper film 2 from a material containing silicon, aluminum, and oxygen significantly decreases the etching rate in fluorine-based gas, it does not mean that no etching will occur. Furthermore, it does not mean that no film reduction will occur when etching stopper film 2 is subjected to chemical cleaning. Taking into consideration the influence of dry etching with a fluorine-based gas and the influence of chemical cleaning that have been performed before the phase shift masks are manufactured from mask blanks, etching stopper film 2 preferably has a thickness of 3 nm or more, more preferably of 4 nm or more, and even more preferably 5 nm or more.

For etching stopper film 2, although a material with high transmittance with respect to exposure light has been applied, transmittance decreases as the thickness becomes greater. Furthermore, etching stopper film 2 has a refractive index higher than that of the material for forming transparent substrate 1, and the thicker the thickness of etching stopper film 2, the greater the influence it has when designing the actual mask pattern to be formed on phase shift film 3 (a pattern to which mask pattern bias correction, Optical Proximity Correction (OPC), Sub-Resolution Assist Feature (SRAF), and the like have been applied). Considering these points, the etching stopper film 2 is preferably 20 nm or less, more preferably 15 nm or less, and even more preferably 10 nm or less.

The etching stopper film 2 preferably has a refractive index n with respect to exposure light of the ArF excimer laser (hereinafter, simply referred to as refractive index n) of 1.73 or less, and more preferably 1.72 or less. This is in order to minimize the influence it has when designing the actual mask pattern to be formed on phase shift film 3. Etching stopper film 2 may not have the same refractive index n as transparent substrate 1 since it is formed from an aluminum containing material. Etching stopper film 2 is formed so as to have a refractive index n of 1.57 or more. On the one hand, for etching stopper film 2, the extinction coefficient k (hereinafter, simply referred to as extinction coefficient k) for exposure light of the ArF excimer laser is preferably 0.04 or less. This is in order to increase the transmittance of etching stopper film 2 with respect to exposure light. Etching stopper film 2 is formed from a material having an extinction coefficient k of 0.000 or more.

Etching stopper film 2 preferably has high composition uniformity in the thickness direction (in other words, the difference in content of each constituent element in the thickness direction is within a fluctuation range of 5 atom % or less). On the other hand, etching stopper film 2 may have a film structure having a gradient composition in the thickness direction. In this case, a gradient composition in which the ratio Si/[Si+Al] on the transparent substrate 1 side of etching stopper film 2 is higher than the ratio Si/[Si+Al] on the phase shift film 3 side is preferable. This is because, in etching stopper film 2, the phase shift film 3 side desirably has high durability to dry etching with a fluorine-based gas and high resistance to chemicals as a priority, while the transparent substrate 1 side desirably has high transmittance with respect to exposure light.

Another film may be interposed between transparent substrate 1 and etching stopper film 2. In this case, a material having a higher transmittance with respect to exposure light than etching stopper film 2 and a small refractive index n needs to be applied to other films. When phase shift masks are manufactured from mask blanks, a laminated structure of this another film and etching stopper film 2 exists at light transmissive portions, which are regions of phase shift masks without phase shift film 3. This is because light transmitting parts need to have high transmittance with respect to exposure light and there is a need to increase the overall transmittance of this laminated structure with respect to exposure light. Materials of other films may include, for example, a material made of silicon and oxygen, or a material containing, in addition to these, one or more elements selected from among hafnium (Hf), zirconium (Zr), titanium (Ti), vanadium (V), and boron (B). The aforementioned other film may be formed from a material containing silicon, aluminum, and oxygen and has a higher ratio Si/[Si+Al] than etching stopper film 2. Even in this case, the other film will have a higher transmittance with respect to exposure light and a small refractive index n (coming closer to the material of transparent substrate 1).

The phase shift film 3 is made of a material that is transparent to exposure light and that contains silicon and oxygen, and has a predetermined phase difference. Specifically, patterning is performed only on the phase shift film 3 in the light transmitting part of the two types of light transmitting parts that does not have a light shielding film 5 interposed in the pattern (light shielding part) formed on the light shielding film 5, a light transmitting part having the phase shift film 3 and a light transmitting part not having the phase shift film are formed, and the phase of the exposure light that passes through the light transmitting part having the phase shift film 3 will have an essentially inverse relationship (predetermined phase difference) to the exposure light that passes through the light transmitting part without the phase shift film 3 (ArF excimer laser exposure light). In this way, light is made to cancel each other out as one light passes into the area of the other light by diffraction phenomenon, reducing light intensity at the boundary portion to substantially zero and enhancing the contrast at the boundary portion, for example, resolution. With a Levenson type phase shift mask, the light shielding part is provided at the boundary part, but an optical image with higher contrast can be obtained by the interference between the different light beams that pass from both sides of the light shielding part.

Phase shift film 3 preferably functions to transmit exposure light at a transmittance of 95% or more (transmittance), in addition to causing a phase difference of 150 degrees or more and 200 degrees or less between the exposure light having transmitted through the phase shift film and the exposure light having passed through air for the same distance as the thickness of the phase shift film. Furthermore, the phase difference of the phase shift film 3 is more preferably 150 degrees or more and 180 degrees or less. The exposure light transmittance of the phase shift mask 3 is more preferably 96% or more, and even more preferably 97% or more, from the perspective of increasing the exposure light efficiency.

Recently, a problem has arisen in which, when a phase shift mask is placed in the mask stage of an exposure apparatus and transferred by exposure to a transfer target (such as a resist film on a semiconductor wafer), the best focus of exposure transfer varies highly depending on the pattern line width of the phase shift pattern (in particular, the pattern pitch of the line and space pattern). In order to minimize the fluctuation range of best focus due to the pattern line width of the phase shift pattern, the predetermined phase difference in phase shift film 3 is preferably set to 170 degrees or less.

The phase shift film 3 preferably has a thickness of 180 nm or less, more preferably 177 nm or less, and even more preferably 175 nm or less. The phase shift film 3 preferably has a thickness of 143 nm or more, and more preferably 153 nm or more.

In the phase shift film 3, the refractive index n of the phase shift film with respect to exposure light (ArF Excimer laser light) is preferably 1.52 or more, and more preferably 1.54 or more, in order to satisfy the aforementioned optical characteristics and conditions pertaining to film thickness. Furthermore, phase shift film 3 preferably has a refractive index n of 1.68 or less, and more preferably 1.63 or less. The extinction coefficient k of phase shift film 3 with respect to the ArF Excimer laser exposure light is preferably 0.02 or less, and more preferably close to 0.

Note that the refractive index n and extinction coefficient k of thin films including phase shift film 3 are not determined by the composition of the thin film alone. The film density and crystal state of the thin film also influence its refractive index n and extinction coefficient k. For this reason, when forming a thin film by reactive sputtering, conditions are adjusted such that the thin film has a predetermined refractive index n and extinction coefficient k. When the phase shift film 3 is formed by reactive sputtering, it is effective to adjust the ratio of rare gases and reactive gases (such as oxygen gas) in the mixed gas in order to cause the phase shift film 3 to have the aforementioned range of refractive index n and extinction coefficient k, but there is no restriction to this. Effectiveness thereupon depends on various aspects, e.g., the pressure within the film forming chamber at the time of forming films by reactive sputtering, electric power applied to the sputtering target, and positional relations such as the distance between the target and transparent substrate 1. Furthermore, these film forming conditions are film forming device specific and are adjusted as necessary such that formed phase shift film 3 has a predetermined refractive index n and extinction coefficient k.

With a conventional Levenson type phase shift mask, the dug part is formed by digging the transparent substrate to a predetermined depth, and the phase difference (amount of phase shift) between the exposure light that passes through the non-dug part and the exposure light that passes through the dug part is adjusted by the depth of the dug part. In a case where the transparent substrate is made of synthetic quartz and the phase difference when ArF Excimer laser is used as the exposure light is, for example, 180 degrees, the required depth of the dug part will be approximately 173 nm. The thickness of the light shielding film of a conventional binary mask or the halftone phase shift film of a halftone type phase shift mask is usually less than 100 nm. The etching depth is much deeper when the etched part is formed by dry etching on the transparent substrate as compared to the case where a pattern is formed by dry etching on this type of thin film.

As the depth of the dug part formed by dry etching becomes deeper, there is a tendency for the differences in the etching rate during dry etching to increase when the etched parts are formed due to differences in the line width and shape of the dug parts, and the like. When the transfer pattern of a transfer mask is finer, this effect is more pronounced, and the line width of the dug part will become extremely fine. As the line width of the dug part becomes narrower, the etching gas cannot easily penetrate into the etched part, and therefore the difference in the etching rate between the etched parts in the surface can easily become even larger.

Patterning by conventional dry etching that forms the edged part in the transparent substrate differs from the patterning by etching the phase shift film that is provided on the transparent substrate, and there is no method for detecting the etching endpoint. The formation of the dug part of a conventional digging Levenson type phase shift mask is adjusted by the etching time of dry etching that digs from the surface of the substrate. Therefore, when the etching rate difference between the dug parts on the surface is large, the difference in the digging depth of the dug parts of the phase shift mask that is produced will be large, and there is a problem that there is a possibility of a difference occurring in the phase shift effect of the surface.

On the other hand, for the purpose of increasing the verticality of the side walls of the dug part pattern, a process is performed to make the bias voltage applied when dry etching that forms the dug part on the transparent substrate higher than that of conventionally employed (hereinafter, referred to as "high bias etching"). However, with this high bias etching, there is a problem that a phenomenon where the bottom surface near a sidewall of the dug part is further dug by local etching may occur, and a so-called micro-trench is created. The production of these microtrenches is thought to be due to the fact that the ionized etching gas will be drawn into the pattern sidewall side of the pattern of the light shielding film near the dug part where the resistance is lower than the transparent substrate, due to charge-up caused by the application of bias voltage to the transparent substrate.

On the other hand, instead of forming a dug part in the transparent substrate 1, it is conceivable to laminate the etching stopper film made of $Al_2O_3$ and the phase shift film 3 formed from a material with high transmittance in this order on the transparent substrate 1 and then dry etching the phase shift film 3 to form the phase shift pattern in place of the dug part. In other words, the phase shift pattern 3c (see FIG. 2) is formed in the phase shift film 3, and a structure including a sidewall of the phase shift pattern 3c and the bottom surface of the etching stopper film will have the same optical function as the dug part. In this case, in a case where the etching rate difference on the surface is large when dry etching to form the phase shift pattern 3c on the phase shift film 3, the lower end of the phase shift film 3 will be reached first in areas where dry etching has progressed on the surface. However, in a case where dry etching is continued in this manner until reaching the lower end of the phase shift film 3 in all other areas, the amount of etching will be minimal in the areas where the phase shift film 3 was first completely removed, even though the etching stopper film is exposed to the etching gas, and the transparent substrate 1 will not be subjected to dry etching. Therefore, a structure that includes the phase shift pattern 3c and the etching stopper film, that is eventually achieved, will have high uniformity in the vertical direction (thickness direction). Therefore, the phase shift mask that is produced can have a small difference in the phase shift effect of the surface.

Furthermore, micro-trenches that are easily formed by high bias etching can be suppressed by providing the etching stopper film. However, in a case where chemical cleaning needs to be performed thereafter, there is a problem where the etching stopper film that has low resistance towards chemical cleaning dissolves and the phase shift pattern is prone to fall off.

In order to resolve this problem with the cleaning chemical resistance of the etching stopper film, the etching stopper film 2 of the first embodiment is made of a material containing silicon, aluminum, and oxygen. Thereby, the etching stopper film 2 will not be eliminated even when over-etching is performed with respect to phase shift film 3, etching stopper film 2 can inhibit micro-trenches, which are prone to be produced by high bias etching, etching stopper film 2 has sufficiently high resistance to chemical cleaning, which will be performed thereafter, and the phenomenon of the phase shift pattern falling off is inhibited.

The phase shift film 3 may be configured of a single layer, or may be configured by laminating a plurality of layers, but the phase shift layer is made of materials containing silicon and oxygen. By containing oxygen in addition to silicon, high transparency toward the exposure light can be ensured, and preferable optical properties as a phase shift film can be obtained.

The phase shift film 3 is made from materials containing silicon and oxygen as described above, but in order to increase the light fastness and transmittance towards exposure light, as well as to increase the processability by dry etching, the amount of elements other than silicon and oxygen is preferably 5 atom % or less, and more preferably 3 atom % or less. Furthermore, a material made of silicon and oxygen, such as $SiO_2$, is preferable. In a case where the phase shift film 3 is formed by a sputtering method, rare gases such as helium (He), neon (Ne), argon (Ar), Krypton (Kr), Xenon (X), and the like which are used as buffer gases, as well as hydrogen (H), carbon (C), and the like are unavoidably included in the film, but even in this case, the total amount of these elements other than silicon and oxygen that are included in the phase shift film 3 is preferably controlled to 5 atom % or less, and more preferably 3 atom % or less, by optimizing the film forming conditions and performing annealing after film forming.

The phase shift film 3 made of a silicon oxide material are formed by sputtering, and any type of sputtering can be used, including DC sputtering, RF sputtering, and ion beam sputtering, or the like. When using targets with low conductivity (silicon targets, $SiO_2$ targets, and the like), RF sputtering or ion beam sputtering is preferably applied, but RF sputtering is more preferably applied when considering the film forming rate.

Detection of etching endpoints during EB defect repair is performed by detecting at least any one of Auger electrons, secondary electrons, characteristic X-rays, and backscattered electrons discharged from irradiated portions when black defects are irradiated with an electron beam. For example, to detect Auger electrons discharged from portions irradiated with an electron beam, changes in material composition are mainly checked by Auger electron spectroscopy (AES). Furthermore, to detect secondary electrons, changes in surface shape are mainly checked from SEM images. In addition, to detect characteristic X-rays, changes in material composition are mainly checked by energy dispersive X-ray spectroscopy (EDX) or wavelength dispersive X-ray spectroscopy (WDX). To detect backscattered electrons, changes in material composition or crystal state are checked by electron backscatter diffraction (EBSD).

With a mask blank with a configuration where a phase shift film 3 made of a material containing silicon and oxygen is provided in contact with a main surface of a transparent substrate 1 made of a glass material, the main component elements of the transparent substrate 1 are silicon and oxygen, so the difference in the phase shift film 3 and the transparent substrate 1 is basically a slight difference in the composition ratio of silicon and oxygen, and a difference in the molecular bonding condition. For this reason, this combination makes it difficult to detect etching endpoints during EB defect repair. In contrast, in a configuration having phase shift film 3 provided in contact with the surface of etching stopper film 2, silicon and oxygen account for most of the components of phase shift film 3, while the etching stopper film 2 also includes aluminum in addition to silicon and oxygen. For this reason, detection of aluminum alone can serve as a guide for determining the etching endpoints for EB defect repair, and thus detection of endpoints is relatively easy.

Regarding light shielding film 5, either a single layer structure or a laminated structure of two or more layers can be used. Furthermore, each layer of a light shielding film of the single layer structure and a light shielding film of the laminated structure of two or more layers may be configured to have substantially the same composition in the film thickness direction or layer thickness direction, or may be configured to have a gradient composition in the layer thickness direction.

Mask blank 101 illustrated in FIG. 1 is configured with light shielding film 5 laminated on phase shift film 3, with no other film interposed therebetween. In the case of light shielding film 5 of this configuration, a material with sufficient etching selectivity needs to be applied to the etching gas to be used when forming patterns on the phase shift film 3.

As a material that satisfies this condition, a material containing chromium is used as the light shielding film 5 in the present embodiment 1. Chromium containing materials for forming light shielding film 5 include, in addition to chromium metals, materials containing chromium (Cr) and one or more elements selected from among oxygen (O), nitrogen (N), carbon (C), boron (B), and fluorine (F). Generally, chromium-based materials are etched by a mixed gas made up of a chlorine-based gas and oxygen gas; however, chromium metals do not have a very high etching rate with respect to such an etching gas. With consideration to increasing the etching rate with respect to a mixed gas made up of a chlorine-based gas and oxygen gas, the material for forming light shielding film 5 is preferably a material containing chromium and one or more elements selected from among oxygen, nitrogen, carbon, boron, and fluorine. Furthermore, the chromium containing material for forming light shielding film may incorporate one or more elements from molybdenum (Mo), indium (In), and tin (Sn). By incorporating one or more elements from molybdenum, indium, and tin, it is possible to make faster the etching rate with respect to a mixed gas made up of a chlorine-based gas and oxygen gas.

The light shielding film 5 made of a material containing chromium is formed by sputtering, and any type of sputtering can be used, such as DC sputtering, RF sputtering, and ion beam sputtering. Of these, RF sputtering is preferably used from the perspective of the film forming rate.

Figure 2:
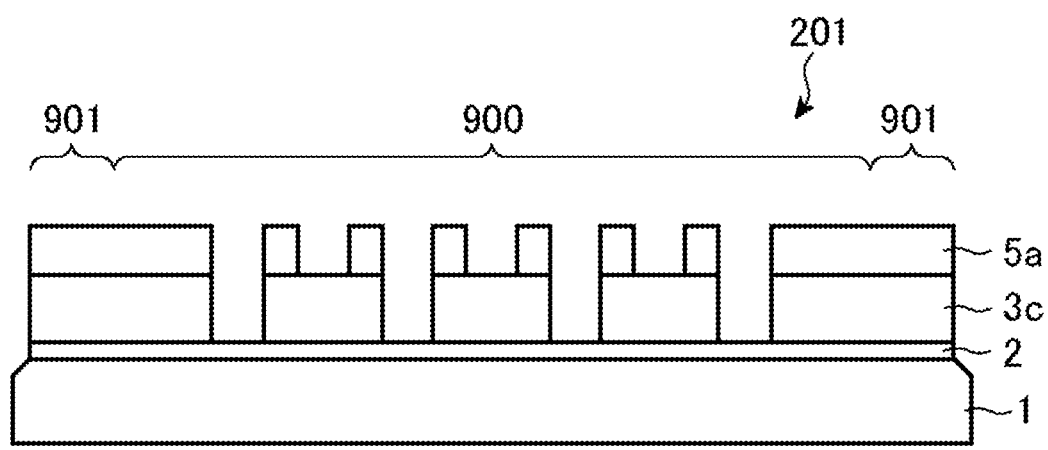
FIG. 2 is a cross-sectional view illustrating a configuration of a phase shift mask according to the first embodiment and the second embodiment of the present invention.

The light shielding film 5 is required to have a function that shields exposure light with high shielding efficiency. This is because the exposure light preferably is not transmitted through the light shielding pattern 5a in order to increase the phase shift effect that occurs between the exposure light that passes through the space part of the phase shift pattern 3c (corresponding to the dug part of a conventional digging Levenson type phase shift mask) and the exposure light that passes through the pattern part without the light shielding pattern 5a (see FIG. 2) on an upper part (corresponding to the light transmitting part of a conventional digging Levenson type phase shift mask). In view of the above, the light shielding film 5 is required to ensure an optical density (OD) of more than 2.0, preferably an OD of 2.8 or more, and more preferably an OD of 3.0 or more, similar to a binary mask. Herein, as illustrated in FIG. 2, the light shielding band shaped region 901 is formed in order to prevent negative effects (exposure by exposure light) by adjacent exposure light when performing exposure light transfer to a wafer, by the light shielding region formed on the outside of the pattern shaped region 900 formed with a pattern (circuit pattern) that is the subject of the exposure light transfer.

In the present embodiment 1, a hard mask film 6 can be laminated onto the light shielding film 5 (see FIGS. 3A-G). This hard mask film 6 is formed from a material having etching selectivity with respect to the etching gas used when etching the light shielding film 5. Thereby, as described below, the thickness of the resist film can be made significantly thinner than when the resist film is directly used as a mask for light shielding film 5.

As described above, because the light shielding film 5 needs to ensure a predetermined optical density and have sufficient light shielding function, there is a limit to the reduction in thickness thereof. On the one hand, hard mask film 6 only has to have such a film thickness so as to be able to function as an etching mask until the dry etching for forming a pattern on light shielding film 5 located directly underneath is complete, and is not subject to optical restrictions as a rule. For this reason, the thickness of hard mask film 6 can be made significantly thinner compared to the thickness of light shielding film 5. On the other hand, because the resist film of an organic material only has to have such a film thickness so as to be able to function as an etching mask until the dry etching for forming a pattern on this hard mask film 6 ends, the thickness of the resist film can be made significantly thinner than when the resist film is used as a direct mask onto light shielding film 5. Since the resist film can also be made thinner in this way, it is possible to enhance resist resolution and prevent the formed pattern from collapsing.

As described above, while hard mask film 6 laminated onto light shielding film 5 is preferably formed from the aforementioned material, the present invention is not limited to this embodiment. In mask blank 101, a resist pattern may be directly formed on light shielding film 5 and etching of light shielding film 5 may be directly performed with the resist pattern serving as a mask, without forming a hard mask 6.

This hard mask film 6 is preferably formed from a material containing silicon in a case where light shielding film 5 is formed from a material containing chromium. Here, in this case, the hard mask film 6 tends to have low adhesion to resist films of organic materials, so the surface of the hard mask film 6 is preferably subjected to HMDS (Hexamethyldisilazane) treatment to enhance surface adhesion. Note that in this case, hard mask film 6 is more preferably formed from $SiO_2$, SiN, SiON, and the like.

Furthermore, as the material for the hard mask film 6 in a case in which light shielding film 5 is formed from a chromium containing material, the material containing tantalum (Ta) can be used. In this case, materials containing tantalum include, in addition to tantalum metals, materials containing tantalum and one or more elements selected from among nitrogen, oxygen, boron, and carbon. Examples thereof include Ta, TaN, TaO, TaON, TaBN, TaBO, TaBON, TaCN, TaCO, TaCON, TaBCN, and TaB OCN. Note that the hard mask film 6 in this case preferably is formed so as to not contain silicon. The permissible silicon content is preferably 5 atom % or less, more preferably 3 atom % or less, and even more preferably it does not substantially contain silicon.

In mask blank 101, a resist film of an organic material having a film thickness of 100 nm or less is preferably formed in contact with the surface of hard mask film 6. In the case of fine patterns supporting the hp 32 nm generation of DRAMs, an SRAF (Sub-Resolution Assist Feature) with a line width of 40 nm may be provided on a transfer pattern (phase shift pattern) to be formed on hard mask film 6. Even in a case such as this, the aspect ratio of the cross section of resist patterns is as low as 1:2.5, so resist patterns are inhibited from collapsing or peeling off during the development, rinsing, etc., of the resist film. Note that the film thickness of the resist film is more preferably 80 nm or less as this will further inhibit resist patterns from collapsing or being peeled off.

Etching stopper film 2, phase shift film 3, light shielding film 5, and hard mask film 6 are formed by sputtering, with any sputtering being applicable, such as DC sputtering, RF sputtering, and ion beam sputtering. When using targets with low conductivity, RF sputtering or ion beam sputtering is preferably applied, with RF sputtering more preferably taking the film forming rate into consideration.

Regarding the film forming method for etching stopper film 2, it is preferable to place two targets, i.e., a mixed target of silicon and oxygen and a mixed target of aluminum and oxygen, in the film forming chamber, and form etching stopper film 2 on transparent substrate 1. Specifically, transparent substrate 1 is placed at the substrate stage within the film forming chamber and a predetermined voltage is applied to each of the two targets under a rare gas atmosphere such as argon gas (or a mixed gas atmosphere with oxygen gas or an oxygen containing gas) (in this case, an RF power supply is preferable). Thereby, rare gas particles that have turned into plasma collide with the two targets to respectively generate a sputtering phenomenon, forming etching stopper film 2 containing silicon, aluminum, and oxygen on the surface of transparent substrate 1. Note that in this case, a $SiO_2$ target and $Al_2O_3$ target are more preferably applied as the two targets.

Additionally, etching stopper film 2 may be formed with only a mixed target of silicon, aluminum, and oxygen (preferably, a mixed target of $SiO_2$ and $Al_2O_3$; the same applies hereinafter), and two targets including a mixed target of silicon, aluminum, and oxygen and a silicon target, or including a mixed target of aluminum and oxygen and an aluminum target may be made to discharge electricity to form etching stopper film 2.

As stated above, the mask blank 101 of the first embodiment includes etching stopper film 2 containing silicon, aluminum, and oxygen between transparent substrate 1 and phase shift film 3. Moreover, this etching stopper film 2 simultaneously satisfies the following three characteristics: higher durability than that of transparent substrate 1 to dry etching with a fluorine-based gas, which is performed when forming a phase shift pattern on phase shift film 3; high resistance to chemical cleaning; and high transmittance with respect to exposure light. Thereby, etching to the etching stopper film 2 can be highly suppressed when forming the phase shift pattern 3c on the phase shift film 3 by dry etching using a fluorine-based gas. Furthermore, a structure that includes the phase shift pattern 3c formed in this manner and the bottom surface of the etching stopper film 2 will have high uniformity in the vertical direction (thickness direction) on the surface. Therefore, the phase shift mask 201 that is eventually produced will have high uniformity in the phase shift effect of the surface. Furthermore, when repairing defects in phase shift patterns discovered during the process of manufacturing phase shift masks by EB defect repair, defects can be accurately repaired because etching endpoints are easy to detect.

[Phase Shift Mask and Manufacture Thereof]

This phase shift mask 201 according to the first embodiment (see FIG. 2) is featured in that the etching stopper film 2 of mask blank 101 remains across the entire surface of the main surface of the transparent substrate 1, a phase shift pattern 3c is formed on phase shift film 3, and a light shielding pattern 5a is formed on the light shielding film 5. In the case of the configuration in which the hard mask film 6 is provided on mask blank 101, the hard mask film 6 is removed during the process of making the phase shift mask 201 (see FIGS. 3A-G).

In other words, the phase shift mask 201 according to the first embodiment includes an etching stopper film 2, a phase shift pattern 3c, and a light shielding film 5, laminated in this order on the transparent substrate 1; wherein the phase shift pattern 3c is made of a material containing silicon and oxygen; and the etching stopper film 2 is made of a material containing silicon, aluminum, and oxygen.

The method of manufacturing the phase shift mask 201 according to the first embodiment uses the aforementioned mask blank 101 and includes the steps of: forming a transfer pattern 5a including a light shielding band on light shielding film 5 by dry etching using a chlorine-based gas, and forming a phase shift pattern 3c on phase shift film 3 by dry etching using a fluorine-based gas using, as masks, the light shielding film 5 having a light shielding pattern 5a and a resist film having the resist pattern 8b (see FIGS. 3A-G).

Hereinafter, the method for manufacturing this phase shift mask 201 according to the first embodiment will be described while following the manufacturing steps illustrated in FIGS. 3A to 3G, which are cross-sectional structure views of a main component. Note that the method for manufacturing the phase shift mask 201 that uses the mask blank 101, in which hard mask film 6 is laminated onto light shielding film 5, is described here. Furthermore, for the first embodiment, a case in which a material containing chromium is used in the light shielding film 5 and a material containing silicon is used in the hard mask film 6 is described.

First, a resist film is formed by a spin coating method in contact with hard mask film 6 in mask blank 101. Next, a light shielding pattern to be formed on the light shielding film 5 is written by an electron beam onto the resist film, and a first resist pattern 7a is formed by further performing a predetermined treatment such as a developing process or the like (see FIG. 3A). Subsequently, the first hard mask pattern 6a is formed on the hard mask film 6 by performing first dry etching with a fluorine-based gas such as $CF_4$ or the like is performed, with the first resist pattern 7a serving as a mask (see FIG. 3B).

Figure 3A:
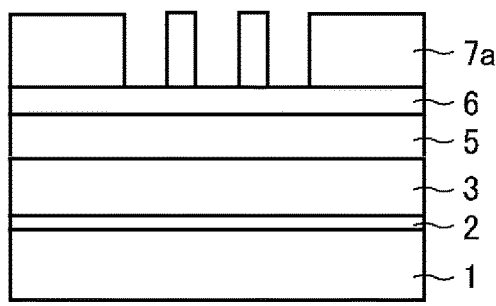
FIGS. 3A to 3G are cross-sectional schematic views illustrating manufacturing steps for a phase shift mask according to the first embodiment and the second embodiment of the present invention.
Figure 3B:
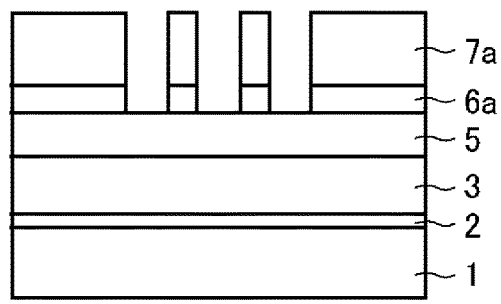
Figure 3C:
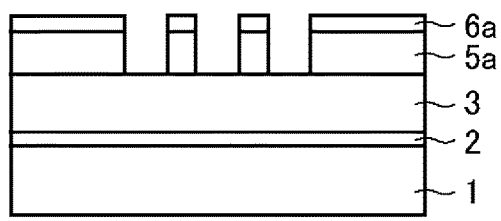

Next, after removing resist pattern 7a, the first light shielding pattern 5a is formed on the light shielding film 5 by performing second dry etching with a mixed gas containing a chlorine-based gas and oxygen gas using a hard mask pattern 6a as a mask (see FIG. 3C). By performing a second dry etching, the film thickness of the hard mask pattern 6a is made thinner than the film thickness prior to dry etching.

Figure 3D:
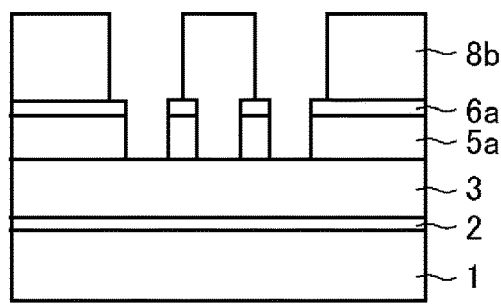

Next, a second resist pattern 8b is formed by forming a resist film by a spin coating method, then writing a pattern by an electron beam onto the resist film, and further performing a predetermined treatment such as a developing process or the like (see FIG. 3D).

Subsequently, a third dry etching is performed using a fluorine-based gas such as $CF_4$ or the like to form a phase shift pattern 3c on the phase shift film 3 (see FIG. 3E). With the third dry etching on the phase shift film 3, the second resist pattern 8b and the light shielding pattern 5a are patterns for the etching mask, but the position of the edge part of the phase shift pattern 3c is determined by the edge part of the light shielding pattern 5a, so the writing transfer position accuracy (alignment accuracy) of the second resist pattern 8b can be relatively relaxed. Note that with the third dry etching, the hard mask pattern 6a becomes the hard mask pattern 6d that was dry etched using the second resist pattern 8b as a mask.

During the third dry etching of this phase shift film 3 with a fluorine-based gas, additional etching (over-etching) is performed to increase the verticality of the pattern sidewall of the phase shift pattern 3c and the uniformity of the CD (Critical Dimension) of the surface of the phase shift pattern 3c. Even after such over-etching, the surface of the etching stopper film 2 is only minutely etched, with the surface of the transparent substrate 1 not exposed at the surface 701 of the opening part of the phase shift pattern 3c.

Subsequently, the second resist pattern 8b is removed by ashing or by using a peeling solution or the like (see FIG. 3F), and then the hard mask pattern 6d remaining on the light shielding pattern 5a is removed (see FIG. 3G). Removal of the hard mask pattern 6d can be performed by dry etching using a fluorine-based gas. Note that the effect on exposure light transferring will be minimal even if the hard mask pattern 6d remains as is without removing, and therefore the hard mask pattern 6d can remain in place, but removing is preferable because the hard mask pattern can be a cause of pseudo defects during mask pattern defect inspection.

Subsequently, a cleaning step is performed, and then a mask defect inspection is performed as necessary. Furthermore, defect repair is performed as necessary depending on the results of the defect inspection, and thereby the phase shift mask 201 is manufactured. Ammonia-hydrogen peroxide was used in the cleaning step, but the surface of etching stopper film 2 is hardly dissolved, so the surface of the transparent substrate 1 is not exposed at the opening part (the surface 701) of the phase shift pattern 3c.

Note, the chlorine-based gas used in dry etching of the light shielding film 5 is not particularly limited as long as it contains chlorine (Cl). Examples thereof include $Cl_2$, $SiCl_2$, $CHCl_3$, $CH_2Cl_2$, and $BCl_3$. Furthermore, because mask blank 101 includes the etching stopper film 2 on the transparent substrate 1, the fluorine-based gas used in dry etching of the hard mask film 6 and the phase shift film 3 is not particularly limited as long as it contains fluorine (F). Examples thereof include $CHF_3$, $CF_4$, $C_2F_6$, $C_4F_8$, and $SF_6$.

This phase shift mask 201 of the first embodiment was made using the aforementioned mask blank 101. For this reason, in this phase shift mask 201 of the first embodiment, the side walls of phase shift pattern 3c have high verticality and phase shift pattern 3c also has high CD uniformity on the surface. A structure that includes the phase shift pattern 3c and the bottom surface of the etching stopper film 2 will have high uniformity in the vertical direction (thickness direction) on the surface. Therefore, the phase shift mask 201 will have high uniformity in the phase shift effect of the surface. Furthermore, when defects are discovered in phase shift pattern 3c during the process of manufacturing the phase shift mask 201 and the defects are repaired by EB defect repair, the defects can be accurately repaired because etching stopper function is highly enhanced and etching endpoints are easy to detect.

[Manufacture of Semiconductor Device]

The method for manufacturing a semiconductor device of the first embodiment is featured in that transfer patterns are transferred to resist films on semiconductor substrates by exposure using phase shift mask 201 of the first embodiment or phase shift mask 201 manufactured using mask blank 101 of the first embodiment. The phase shift mask 201 of the first embodiment has high verticality in the side walls of the phase shift pattern 3c, and also has high CD uniformity in the surface, as well as high uniformity in phase shift effect in the surface. For this reason, transfer by exposure to resist films on semiconductor devices using the phase shift mask 201 of the first embodiment allows patterns to be formed on the resist films of the semiconductor devices with sufficient accuracy to satisfy design specifications.

Furthermore, even when exposure transfer to a resist film is performed on semiconductor devices using phase shift masks in which defects having existed in the phase shift pattern 3c have been repaired by EB defect repair during manufacturing process, the defects are repaired with high accuracy, and the occurrence of transfer failure can be prevented in areas in the resist films of the semiconductor devices corresponding to the areas in the phase shift pattern 3c where defects of the phase shift mask have existed. For this reason, in a case where circuit patterns are formed using these resist patterns as a mask to perform dry etching in the film to be processed, circuit patterns can be formed with high accuracy and high yield without shortcuts and disconnection of wires due to insufficient accuracy or transfer defects.

Note that up to this point, an embodiment in which a mask blank according to the first embodiment was used to manufacture a Levenson type phase shift mask was described. However, the mask blank of the first embodiment can also be similarly used for the purpose of use in manufacturing a CPL (Chromeless Phase Lithography) mask. A CPL mask is a type of phase shift mask where a transfer pattern is configured by a dug part and a non-dug part of a transparent substrate, basically without providing a light shielding film in the transfer pattern forming region, except in large pattern regions. Generally, a CPL mask has a repeating pattern of non-dug parts and dug parts formed on a transparent substrate. Furthermore, the depth of the dug part is adjusted such that an interference effect (phase shift effect) occurs between the exposure light that passes through the non-dug part and the exposure light that passes through the dug part.

With a CPL mask, the exposure light that passes through the non-dug part interferes with the refracted exposure light that passes from the two dug parts interposed on both sides of the non-dug part, and the amount of exposure light in this region is essentially zero, so this region becomes a dark region of the optical image that has passed through the CPL mask. With the mask blank of the first embodiment, the dug part of the CPL mask can be replaced by a structure that includes the pattern of the phase shift film 3 and the etching stopper film 2, and therefore the CPL mask can easily be manufactured. Note that the effects when applying the mask blank of the first embodiment to the manufacture of a CPL mask are the same as when used to the aforementioned Levenson type phase shift mask.

Second Embodiment

[Mask Blank and Manufacture Thereof]

The mask blank according to the second embodiment of the present invention is a mask blank for a phase shift mask where the material of the light shielding film and the hard mask film are different from those used in the first embodiment. With the mask blank of the second embodiment, the light shielding film 5 contains at least one element selected from silicon and tantalum, and the hard mask film 6 is a film containing chromium. Other components of the mask blank according to the second embodiment are the same as the mask blank according to the first embodiment. The mask blank according to the second embodiment can provide the same effects as the mask blank according to the first embodiment. Furthermore, the mask blank of the second embodiment can similarly be used to manufacture a CPL mask.

The light shielding film 5 is required to provide light shielding properties, workability, film smoothness, mass productivity, and low defects.

Materials having such characteristics include silicon-containing materials and materials containing a transition metal and silicon. Materials containing a transition metal or silicon have high light shielding performance compared to materials containing silicon but not containing transition metals, making it possible to make the thickness of light shielding film 5 thinner. The transition metal to be contained in light shielding film 5 includes one or more metal selected from molybdenum (Mo), tantalum (Ta), tungsten (W), titanium (Ti), chromium (Cr), hafnium (Hf), nickel (Ni), vanadium (V), zirconium (Zr), ruthenium (Ru), rhodium (Rh), niobium (Nb), and palladium (Pd), and the like, as well as alloys thereof. When forming the light shielding film 5 from a material containing silicon, a metal other than a transition metal (such as tin (Sn), indium (In), and gallium (Ga)) may be incorporated.

The light shielding film 5 can be formed from a material made of silicon and nitrogen or a material containing, in addition to the material made of silicon and nitrogen, one or more elements selected from semimetal elements, non-metal elements, and rare gases. In this case, the light shielding film 5 may contain any semimetal element. Among these semimetal elements, it is preferable to have the light shielding film 5 contain one or more elements selected from boron, germanium, antimony, and tellurium since it is expected to increase the conductivity of silicon used as target when forming light shielding film 5 by the sputtering method.

In a case where light shielding film 5 has a laminated structure including the lower layer and upper layer, the lower layer may be formed from a material made of silicon or a material made of silicon and one or more elements selected from carbon, boron, germanium, antimony, and tellurium, while the upper layer may be formed from a material made of silicon and nitrogen or a material containing, in addition to the material made of silicon and nitrogen, one or more elements selected from among semimetal elements, non-metal elements, and rare gases.

The light shielding film 5 may be formed from a material containing tantalum. In this case, the silicon content of light shielding film 5 is preferably 5 atom % or less, more preferably 3 atom % or less, and even more preferably it does not substantially contain silicon. These materials containing tantalum are materials onto which a transfer pattern can be patterned by dry etching with a fluorine-based gas. In this case, materials containing tantalum include, in addition to tantalum metals, materials incorporating one or more elements selected from among nitrogen, oxygen, boron, and carbon additionally to tantalum. Examples thereof include Ta, TaN, TaO, TaON, TaBN, TaBO, TaBON, TaCN, TaCO, TaCON, TaBCN, and TaBOCN.

Materials for forming light shielding film 5 may incorporate one or more elements selected from among oxygen (O), nitrogen (N), carbon (C), boron (B), and hydrogen (H), as long as the optical density does not significantly decrease. In particular, a tantalum nitride film (TaN film) that contains nitrogen has a tendency to improve the smoothness of the light shielding film, and to improve the roughness of the light shielding pattern. Furthermore, Ta metal readily oxidizes in air, so in a case where the pattern side wall made of only Ta metal is exposed after fabricating the mask pattern, there is a problem that the line width will change in the course of time. In a case where nitrogen is added to the Ta metal, oxidation will come to be inhibited, so in a case where tantalum (Ta) is used in the light shielding film 5, nitrogen is preferably included. Furthermore, boron, carbon, and the like can also be added to the tantalum nitride film in order to further increase the smoothness of the tantalum nitride film. These elements will reduce the light shielding performance and the etching properties of the tantalum metal, so the amount added is preferably 20 atom % or less. Specifically, the light shielding properties are reduced by the addition of boron and carbon. When carbon is added, the etching speed is reduced.

Regarding light shielding film 5, any of a single layer structure and a laminated structure of two or more layers can be used. To reduce the reflectance with respect to exposure light on a surface of light shielding film 5 on the opposite side of transparent substrate 1, the front layer on the opposite side of transparent substrate 1 (the upper layer in the case of a two layer structure having a lower layer and upper layer) may incorporate a large amount of oxygen and nitrogen.

This hard mask film 6 is preferably formed from a material containing chromium. Furthermore, hard mask film 6 is more preferably formed from a material containing, in addition to chromium, one or more elements selected from among nitrogen, oxygen, carbon, hydrogen, and boron. Hard mask film 6 may be formed from a material containing, in addition to these chromium containing materials, at least one or more metal elements selected from among indium (In), tin (Sn), and molybdenum (Mo) (hereinafter, referred to as "metal elements such as indium").

[Phase Shift Mask and the Manufacture Thereof]

The phase shift mask according to the second embodiment is similar to the phase shift mask according to the first embodiment, except that the material that forms the light shielding film 5 is changed, but the effects obtained thereby are similar.

The differing points between the method of manufacturing the phase shift mask according to the second embodiment and the method of manufacturing the phase shift mask according to the first embodiment are simply the processes that require change due to the change in the material that forms the light shielding film 5 and the change in the material that forms the hard mask film 6. Specifically, the first dry etching that is performed in order to form the first hard mask pattern 6a in the hard mask film 6 uses a mixed gas containing chlorine-based gas and oxygen gas. The second dry etching that is performed in order to form the light shielding pattern 5a in the light shielding film 5 uses a fluorine-based gas.

With the method of manufacturing the phase shift mask according to the second embodiment, the pattern shape of the hard mask pattern 6a basically does not change during the third dry etching using the fluorine-based gas when forming the phase shift pattern 3c on the phase shift film 3. This is because the hard mask film 6 according to the second embodiment is formed from a material containing chromium, and has high etching resistance to the fluorine-based gas. Furthermore, the hard mask pattern 6a has a role of protecting so that the light shielding pattern 5a is not etched by the fluorine-based gas during the third dry etching.

[Manufacture of Semiconductor Device]

The method of manufacturing a semiconductor device according to the second embodiment is the same as the method of manufacturing a semiconductor device according to the first embodiment, except that the phase shift mask of the second embodiment is used. Furthermore, the effects of using the phase shift mask of the second embodiment are the same as the method of manufacturing a semiconductor device according to the first embodiment.

Third Embodiment

[Mask Blank and Manufacture Thereof]

The mask blank 103 according to the third embodiment of the present invention (see FIG. 4) is such that the phase shift film 3 with the mask blank structure described in the first embodiment is a laminate type phase shift film 4. In other words, the laminate type phase shift film 4 is configured with a lower layer 31 made of a material containing silicon and oxygen (SiO-based material) and an upper layer 32 with an etching stopper function made of a material containing silicon, aluminum, and oxygen (SiAlO-based material). The phase shift film 4 provides a predetermined phase shift with the lower layer 31 and the upper layer 32 altogether (see FIG. 4). The transparent substrate 1, etching stopper film 2, light shielding film 5, and hard mask film 6 of the third embodiment are the same as in the first embodiment, and the materials and manufacturing method are also the same. The lower layer 31 is also made of the same materials as in the phase shift film 3 in the first embodiment, and is in accordance with the same manufacturing method.

The lower layer 31 of the third embodiment is required to provide a predetermined phase difference to the exposure light by the entire phase shift film 4 with a laminate configuration of the lower layer 31 and the upper layer 32, and therefore the film thickness is different than the film thickness of the phase shift film 3 of the first embodiment. In detail, the phase shift film 4 has a function of generating a phase difference of 150 degrees or more and 200 degrees or less (preferably 150 degrees or more and 180 degrees or less) to the exposure light transmitted through the phase shift film 4 as compared to the exposure light transmitted through air for the same distance as the thickness of the phase shift film 4, and the transmittance toward the exposure light is at least 95% or more. Furthermore, more preferably, the phase shift film 4 has a transmittance of 96% or more, and more preferably 97% or more. Herein, the film thickness of the upper layer 32 made of the SiAlO-based material is 3 nm or more, preferably 4 nm or more, and more preferably 5 nm or more and 20 nm or less, preferably 15 nm or less, and more preferably 10 nm or less. On the other hand, the film thickness of the lower layer 31 made of the SiO-based material is 120 nm or more, preferably 130 nm or more, and more preferably 140 nm or more and 170 nm or less, preferably 160 nm or less, and more preferably 150 nm or less. The third embodiment is described below while focusing on its differences from the first embodiment.

The upper layer 32 is similar to the etching stopper film 2 with regard to the component elements and the like. The upper layer 32 and the etching stopper film 2 can be made from the same component elements and have the same composition, and also can be made of different component elements and a different composition. The upper layer 32 has the aforementioned phase shift function, but also has an etching stopper function so that the surface of the phase surface pattern is not etched when the hard mask pattern 6d is removed. In other words, the surface 700 of the exposed upper layer pattern 32c is etched by the etching when removing the hard mask pattern, and is provided in order to prevent the film thickness of the phase shift pattern from deviating from a predetermined value, and to prevent the surface from becoming rough (see FIGS. 6A-H). In a case where the film thickness deviates from a predetermined value, there is some fear that the phase difference of the phase shift pattern with regard to the exposure light might deviate from the predetermined value, and there is some possibility that the light exposure transmittance might be reduced if the surface is rough.

[Phase Shift Mask and Manufacture Thereof]

Figure 5:
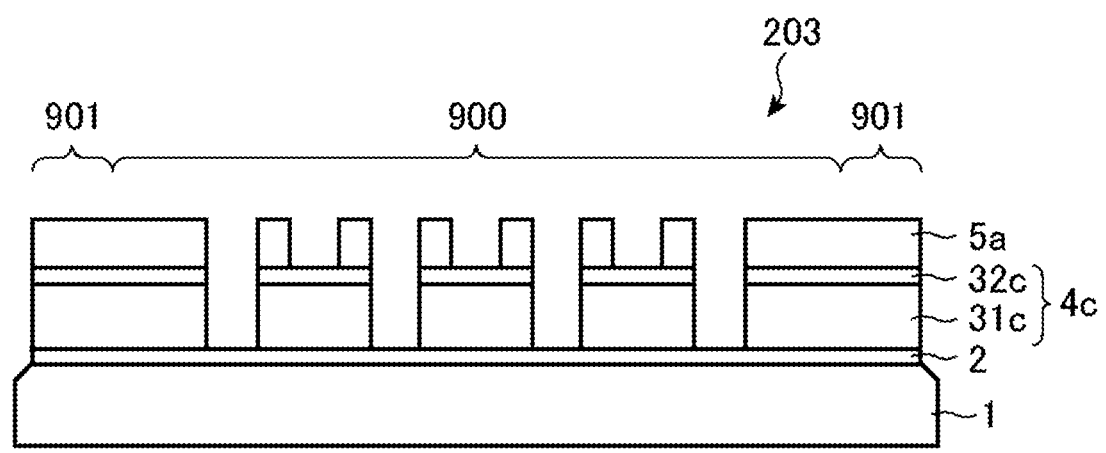
FIG. 5 is a cross-sectional view illustrating a configuration of a phase shift mask according to the third embodiment and the fourth embodiment of the present invention.

The phase shift mask 203 according to the third embodiment (see FIG. 5) has, in addition to the characteristics of the first embodiment, a first characteristic where the phase shift pattern 4c is made of a laminated pattern that includes the lower layer pattern 31c and the upper layer pattern 32c, and configures a phase shift pattern that provides a predetermined phase difference to the exposure light by the laminate structure. Furthermore, a second characteristic is that the light shielding pattern 5a is formed on the upper layer pattern 32c that has the etching stopper function.

In other words, the phase shift mask 203 according to the third embodiment as a structure where the etching stopper film 2, phase shift film 4c, and light shielding film 5a are laminated in this order on the transparent substrate 1; wherein the phase shift pattern 4c has a structure where the lower layer pattern 31c made of material containing silicon and oxygen and the upper layer pattern 32c made of a material containing silicon, aluminum, and oxygen are laminated in this order, and the etching stopper layer 2 is made of a material containing silicon, aluminum, and oxygen.

The method of manufacturing the phase shift mask according to the third embodiment uses the mask blank 103, and hereinafter, the method for manufacturing this phase shift mask 203 according to the third embodiment will be described following the manufacturing steps illustrated in FIGS. 6A to 6H. Herein, the case where a chromium-containing material is applied to light shielding film 5 and a silicon-containing material is applied to the hard mask film 6 will be described.

Figure 6A:
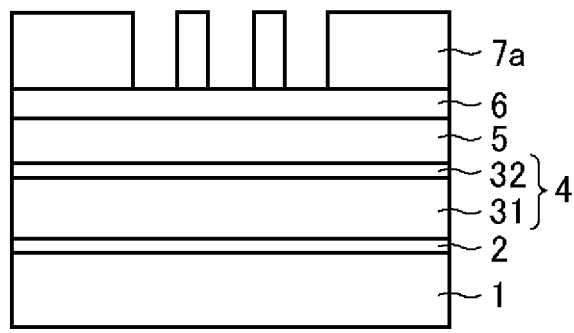
FIGS. 6A to 6H are cross-sectional schematic views illustrating manufacturing steps for a phase shift mask according to the third embodiment and the fourth embodiment of the present invention.
Figure 6B:
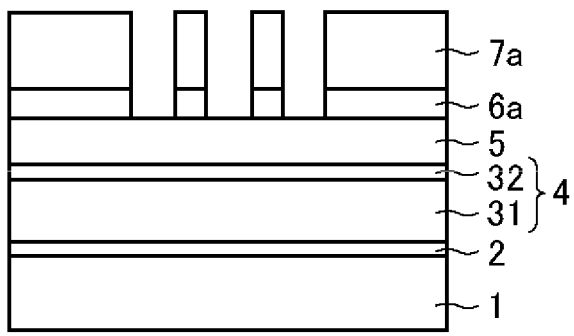

First, the first resist pattern 7a is formed (see FIG. 6A) and, subsequently, a hard mask pattern 6a is formed on hard mask film 6 by performing dry etching with a fluorine-based gas such as $CF_4$ or the like using the resist pattern 7a as a mask (see FIG. 6B). Next, after removing resist pattern 7a, the first light shielding pattern 5a is formed on the light shielding film 5 by performing dry etching with a mixed gas made up of a chlorine-based gas and oxygen gas using hard mask pattern 6a as a mask (see FIG. 6C).

Subsequently, the second resist pattern 8b is formed in order to form the shift pattern 4c (see FIG. 6D). Subsequently, the upper layer pattern 32c is formed on the upper layer 32 by performing dry etching using a mixed gas containing boron chloride ($BCl_3$) and chlorine ($Cl_2$) (see FIG. 6E) and, then, the lower layer pattern 31c is formed on the lower layer 31 by performing dry etching using a fluorine-based gas such as $CF_4$ or the like (see FIG. 6F). In this manner, the phase shift pattern 4c including the lower layer pattern 31c and the upper layer pattern 32c is formed.

Subsequently, the second resist pattern 8b is removed by ashing or by using a peeling solution or the like (see FIG. 6G), and furthermore the remaining hard mask pattern 6d is removed by dry etching using a fluorine-based gas such as $CF_4$ or the like, to obtain the phase shift mask 203 by a predetermined process such as cleaning or the like (see FIG. 6H). Thereupon, in the area where the surface 700 of the upper layer pattern 32c is exposed, the material that forms this area is a SiAlO-based material having an etching stopper function, and therefore the surface 700 is hardly subject to etching, and the phase shift pattern 4c ensures a predetermined phase difference with respect to the exposure light. Ammonia-hydrogen peroxide was used in the cleaning step, but the surface of etching stopper film 2 was scarcely dissolved, with the surface of transparent substrate 1 not exposed at light transmissive portions of phase shift pattern 4c. Furthermore, the surface 700 wherein the upper layer pattern 32c is exposed is hardly dissolved, and the predetermined shape and film thickness are ensured. Note that the aforementioned chlorine-based gas and fluorine-based gas used in dry etching are the same as those used in the first embodiment.

The phase shift mask 203 of the third embodiment has high verticality in the side walls of the phase shift pattern 4c mainly occupied by the lower layer pattern 31c, the CD uniformity in the surface is high, and the uniformity of the phase shift effect in the surface is also high. For this reason, transferring by exposure to resist films on semiconductor devices using phase shift mask 203 of the third embodiment allows patterns to be formed on the resist films of the semiconductor devices with sufficient accuracy to satisfy design specifications. Note that the mask blank of the third embodiment can similarly be applied to manufacturing a CPL mask, similar to the first embodiment.

Fourth Embodiment

[Mask Blank and Manufacture Thereof]

The mask blank according to the fourth embodiment of the present invention is a mask blank structure described in the third embodiment, where the light shielding film 5 and the hard mask film 6 are changed to the material of the light shielding film 5 and the hard mask film 6 described in the second embodiment. In other words, in the fourth embodiment, the light shielding film 5 contains at least one element selected from silicon and tantalum, and the hard mask film 6 is a film containing chromium. Other components are similar to the mask blank of the third embodiment. The mask blank according to the fourth embodiment can provide the same effects as the mask blank according to the third embodiment. Furthermore, because of this configuration, the upper layer 32 is the etching stopper when etching the light shielding film 5. Therefore, the shape of the light shielding pattern 5a that is formed by dry etching using a fluorine-based gas and the in-plane CD uniformity can be improved while providing a phase shift pattern 4c with high phase controlling properties.

The light shielding film 5 of the fourth embodiment is provided so as to contact the upper layer 32 of the phase shift film 4. Taking into consideration the detection of etching endpoints during defect repair of the light shielding film 5 by EB defect repair, this light shielding film 5 preferably does not contain aluminum if the light shielding layer 5 is formed from a material containing silicon.

[Phase Shift Mask and Manufacture Thereof]

The phase shift mask according to the fourth embodiment is similar to the phase shift mask according to the third embodiment, except that the material that forms the light shielding film 5 is changed to the material of the light shielding film according to the second embodiment, and the effects obtained thereby are similar. The method of manufacturing the phase shift mask according to the fourth embodiment uses the mask blank, and its differences from the method of manufacturing the phase shift mask according to the third embodiment are simply the processes that are changed due to the change in the material that forms the light shielding film 5 and the change in the material that forms the hard mask film 6. The processes that are changed are similar to the processes that correspond to the method of manufacturing the phase shift mask according to the second embodiment.

With the method of manufacturing the phase shift mask according to the fourth embodiment, the pattern shape of the hard mask pattern 6a basically does not change during the dry etching when forming upper layer pattern 32c on the upper layer 32 and the dry etching when forming the lower layer pattern 31c on the lower layer pattern 31. This is because the hard mask film 6 according to the fourth embodiment is formed from a material containing chromium, and has high etching durability to these etching gases. Furthermore, the hard mask pattern 6a has a role of protecting so that the light shielding pattern 5a is not etched by the fluorine-based gas during the dry etching of the lower layer 31.

Herein, when forming the light shielding pattern 5a by dry etching using fluorine gas, the surface thereof is essentially not etched, even in the region where the surface 700 of the upper layer pattern 32c is exposed. Furthermore, the phase shift pattern 4c made from the lower layer pattern 31c and the upper layer pattern 32c ensures a predetermined phase difference for the exposed light. The phase shift mask 203 of the fourth embodiment has high verticality in the side walls of the phase shift pattern 4c mainly occupied by the lower layer pattern 31c, the CD uniformity on the surface is high, and the uniformity of the phase shift effect on the surface is also high. For this reason, transferring by exposure to resist films on semiconductor devices using phase shift mask 203 of the fourth embodiment allows patterns to be formed on the resist films of the semiconductor devices with sufficient accuracy to satisfy design specifications. Note that the mask blank of the fourth embodiment can similarly be applied to manufacturing a CPL mask, similar to the first embodiment.

Fifth Embodiment

[Mask Blank and Manufacture Thereof]

Figure 7:
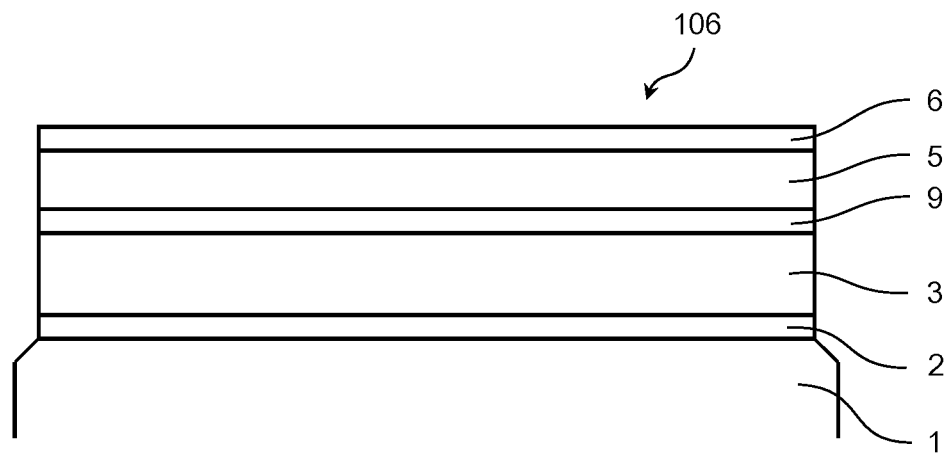
FIG. 7 is a cross-sectional view illustrating a configuration of a mask blank according to a fifth embodiment of the present invention.

The mask blank 106 according to the fifth embodiment of the present invention (see FIG. 7) is such that the mask blank structure described in the second embodiment has a hard mask film 9 between the phase shift film 3 and the light shielding film 5. This hard mask film 9 is formed from a material containing chromium, similar to the hard mask film 6. Other items related to the hard mask film 9 are similar to the case of the hard mask film 6. The mask blank according to the fifth embodiment is preferably applied to manufacturing a CPL mask in particular.

[Phase Shift Mask and Manufacture Thereof]

Figure 8:
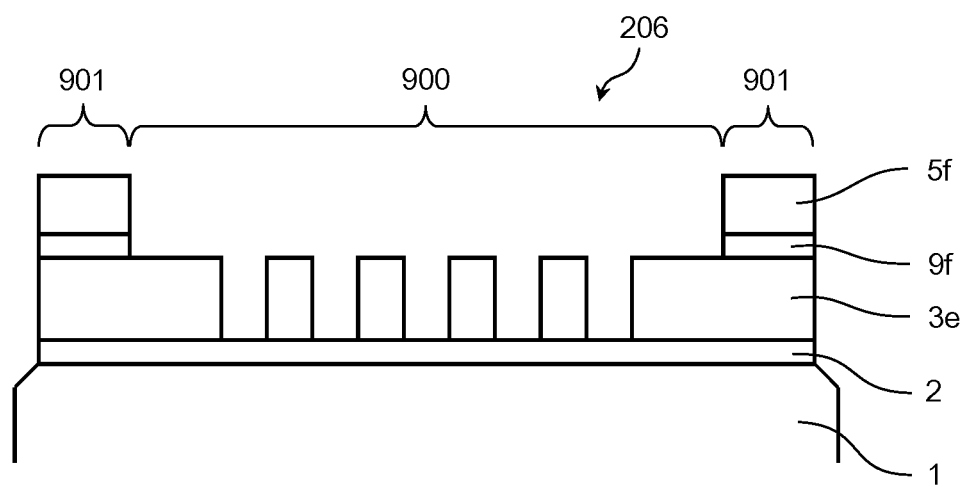
FIG. 8 is a cross-sectional view illustrating a configuration of a phase shift mask according to the fifth embodiment of the present invention.

This phase shift mask 206 according to the fifth embodiment (see FIG. 8) is a CPL mask, and is featured in that the etching stopper film 2 of mask blank 106 remains across the entire surface on the main surface of the transparent substrate 1, a phase shift pattern 3e is formed on the phase shift film 3, and a hard mask pattern 9f is formed in the hard mask 9, and the light shielding pattern 5f is formed in the light shielding film 5. The hard mask film 6 is removed when manufacturing the phase shift mask 206 (see FIGS. 9A-G).

In other words, the phase shift mask 206 according to the fifth embodiment includes an etching stopper film 2, a phase shift pattern 3e, a hard mask pattern 9f, and a light shielding film 5f, laminated in this order on the transparent substrate 1; wherein the phase shift pattern 3e is made of a material containing silicon and oxygen; the hard mask pattern 9f is made of a material containing chromium; the light shielding film 5 is made of a material containing at least one element selected from silicon and tantalum; and the etching stopper film 2 is made of a material containing silicon, aluminum, and oxygen.

The method of manufacturing the phase shift mask 206 according to the fifth embodiment uses the mask blank 106, and includes a step of forming the light shielding pattern on the hard mask film 6 by dry etching using a chlorine-based gas, a step of forming the light shielding pattern 5f on the light shielding film 5 by dry etching using a fluorine-based gas, using the hard mask film with the light shielding pattern (hard mask pattern) 6f having a light-shielding pattern as a mask, a step of forming the phase shift pattern on the hard mask film 9 by dry etching using a chlorine-based gas, a step of forming a phase shift pattern 3e on the phase shift film 3 by dry etching using a fluorine-based gas using the hard mask film with the phase shift pattern (hard mask pattern) 9e as a mask, and a step of forming the hard mask pattern 9f on the hard mask film 9e by dry etching using a chlorine-based gas using the light shielding pattern 5f as a mask (see FIGS. 9A to 9F).

Hereinafter, the method for manufacturing this phase shift mask 206 according to the fifth embodiment will be described while following the manufacturing steps illustrated in FIGS. 9A-G, which are cross-sectional structure views of a main component. Note that the case where a material containing silicon is used for the light shielding film 5 will be described.

First, a resist film is formed in contact with hard mask film 6 in mask blank 106 by the spin coating method. Next, a light shielding pattern formed on the light shielding film 5 is written by an electron beam onto the resist film, and a resist pattern 17f is formed by further performing a predetermined treatment such as a developing process or the like (see FIG. 9A). Subsequently, a hard mask pattern 6f is formed on the hard mask film 6 performing by dry etching with a mixed gas containing a chlorine-based gas and oxygen gas using the resist pattern 17f as a mask (see FIG. 9B).

Figure 9A:
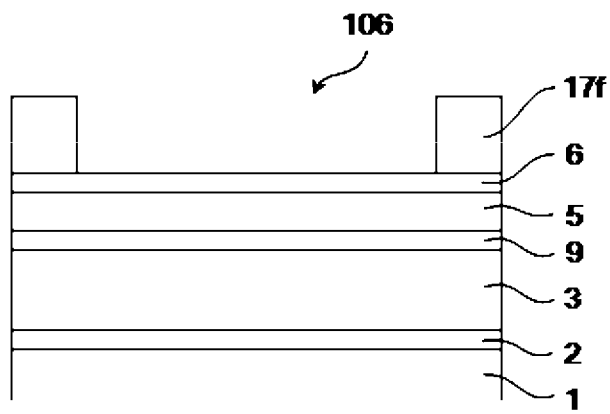
FIGS. 9A to 9G are cross-sectional schematic views illustrating manufacturing steps for a phase shift mask according to the fifth embodiment of the present invention.
Figure 9B:
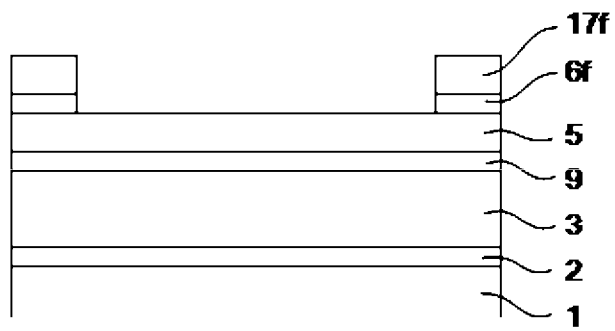
Figure 9C:
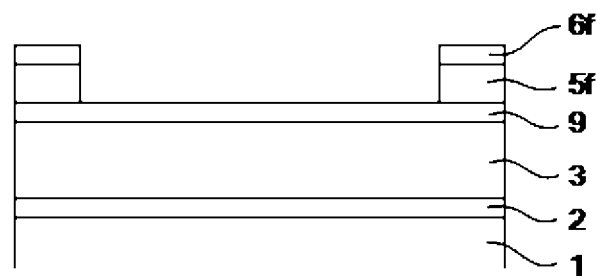

Next, after removing resist pattern 17f, a light shielding pattern 5f is formed on the light shielding film 5 by performing dry etching with fluorine gas such as $CH_4$ or the like using the hard mask pattern 6f as a mask (see FIG. 9C).

Figure 9D:
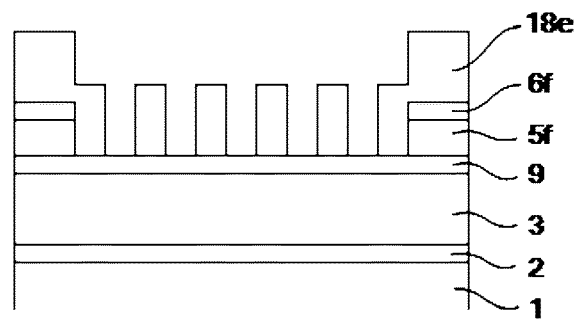

Subsequently, a resist film is formed by a spin coating method, and then the phase shift pattern to be formed on the phase shift film 3 is written by an electron beam onto the resist film, and a resist pattern 18e is formed by further performing a predetermined treatment such as a developing process or the like (see FIG. 9D).

Figure 9E:
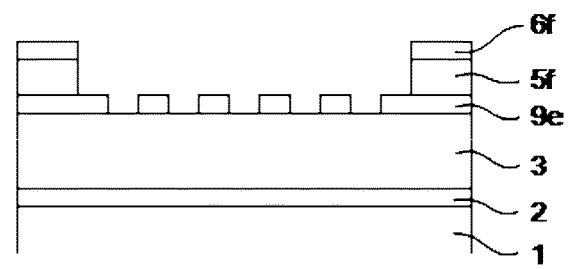
Figure 9F:
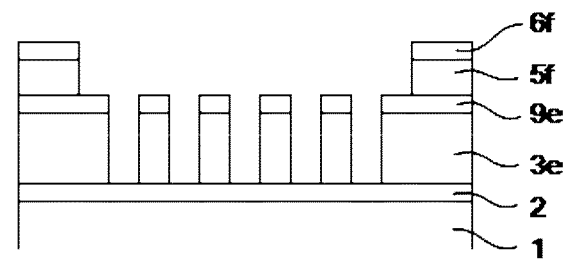
Figure 9G:
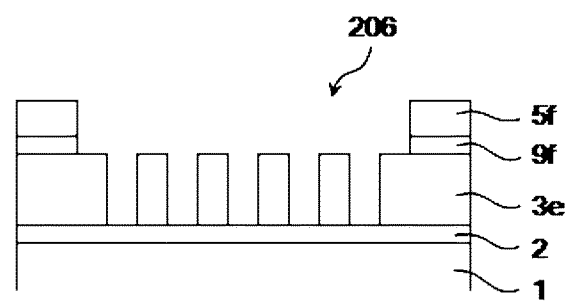

Thereafter, a hard mask pattern 9e is formed on the hard mask film 9 by performing dry etching with a mixed gas containing a chlorine-based gas and oxygen gas using the resist pattern 18e as a mask, to (see FIG. 9E). Next, after removing the resist pattern 18e, a phase shift pattern 3e is formed on the phase shift film 3 by performing dry etching using a fluorine-based gas such as $CF_4$ or the like to form (see FIG. 9F).

Subsequently, a hard mask pattern 9f is formed by performing dry etching with a mixed gas containing a chlorine-based gas and oxygen gas using the light shielding pattern 5f as a mask. At this time, the hard mask pattern 6f is simultaneously removed.

Then, a cleaning step is performed, and a mask defect inspection is performed as necessary. Furthermore, defect repair is performed as necessary depending on the results of the defect inspection, and thereby the phase shift mask 206 is manufactured. Ammonia-hydrogen peroxide was used in the cleaning step, but the surface of etching stopper film 2 is scarcely dissolved, so the surface of the transparent substrate 1 is not exposed at the opening part of the phase shift pattern 3e. Note that the chlorine-based gas and the fluorine-based gas that are used for dry etching in the aforementioned process are the same as in the first embodiment.

This phase shift mask (CPL mask) 206 of the fifth embodiment was fabricated using the aforementioned mask blank 106. For this reason, in this phase shift mask 206 of the fifth embodiment, the side walls of the phase shift pattern 3e have high verticality and the phase shift pattern 3e also has high in-plane CD uniformity. A structure that includes the phase shift pattern 3e and the bottom surface of the etching stopper film 2 will have high uniformity in the vertical direction (thickness direction) on the surface. Therefore, the phase shift mask 206 will have high uniformity in the phase shift effect of the surface. Furthermore, when defects are discovered in phase shift pattern 3e during the process of manufacturing the phase shift mask 206 and the defects are repaired by EB defect repair, the defects can be accurately repaired because etching stopper function is enhanced and etching endpoints are easy to detect.

[Manufacture of Semiconductor Device]

The method for manufacturing a semiconductor device of the fifth embodiment is featured in that the transfer pattern is transferred by exposure to the resist film on the semiconductor substrate using the phase shift mask 206 of the fifth embodiment or the phase shift mask 206 manufactured using the mask blank 106 of the fifth embodiment. The phase shift mask 206 of the first embodiment has high verticality in the side walls of the phase shift pattern 3e and the phase shift pattern 3e also has high CD uniformity on the surface and high uniformity in the phase shift effect in the surface. For this reason, transferring by exposure to resist films on semiconductor devices using phase shift mask 206 of the fifth embodiment allows patterns to be formed on the resist films of the semiconductor devices with sufficient accuracy to satisfy design specifications.

Furthermore, even when exposure transfer to a resist film is performed on semiconductor devices using phase shift masks in which defects existing in the phase shift pattern 3e during manufacturing have been repaired by EB defect repair, the defects are repaired with high accuracy and the occurrence of transfer failure can be prevented in the resist films of the semiconductor devices corresponding to the phase shift pattern 3e areas where defects of the phase shift mask exist. For this reason, in a case where circuit patterns are formed using these resist patterns as a mask to perform dry etching in the film to be processed, circuit patterns can be formed with high accuracy and high yield without shortcuts and disconnection of wires due to insufficient accuracy or transfer defects.

Other Embodiments

[Mask Blank and Manufacture Thereof]

Figure 10:
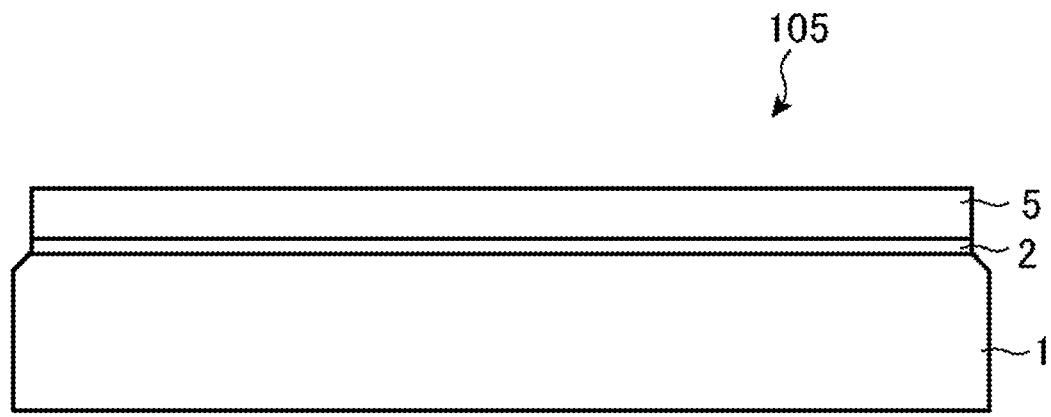
FIG. 10 is a cross-sectional view illustrating a configuration of a mask blank according to another embodiment.

The mask blank according to another embodiment is suitably used for manufacturing a digging Levenson type phase shift mask. As illustrated in FIG. 10, the mask blank 105 has a configuration where an etching stopper film 2 and a light shielding film 5 are laminated in the sequence order on a transparent substrate 1. Furthermore, as necessary, a hard mask film 6 (see FIGS. 12A-H) is formed on the light shielding film 5. The details of the transparent substrate 1 and the etching stopper film 2 are the same as in the first embodiment. Regarding the light shielding film 5 and the hard mask film 6, a combination of a light shielding film 5 made of a material containing chromium and a hard mask film 6 made of a material containing silicon or a material containing tantalum can be used, similar to the first embodiment. Furthermore, regarding the light shielding film 5 and the hard mask film 6, a combination of a light shielding film 5 made of a material containing silicon, a material containing a transition metal, a silicon or a material containing tantalum, and a hard mask film 6 made of a material containing chromium can be used, similar to the second embodiment. The details of the light shielding film 5 and the hard mask film 6 are the same as in the first embodiment and the second embodiment.

The mask blank 105 has an etching stopper film 2 provided between the transparent substrate 1 and the light shielding film 5. Therefore, when the light shielding film 5 is made of a material that is patterned by dry etching using a fluorine-based gas (either of a material containing silicon, a material containing a transition metal and silicon, or a material containing tantalum), the verticality of the sidewall of the light shielding pattern 5a can be increased, and the occurrence of microtrenches in the transparent substrate 1 near the side wall of the light shielding pattern 5a can be suppressed. Furthermore, roughening of the surface of the transparent substrate 1 can be suppressed even when removing the hard mask film 6 by dry etching using a fluorine-based gas. The transmittance of the exposure light is reduced in a case where the surface is rough.

[Phase shift mask and Manufacture Thereof]

Figure 11:
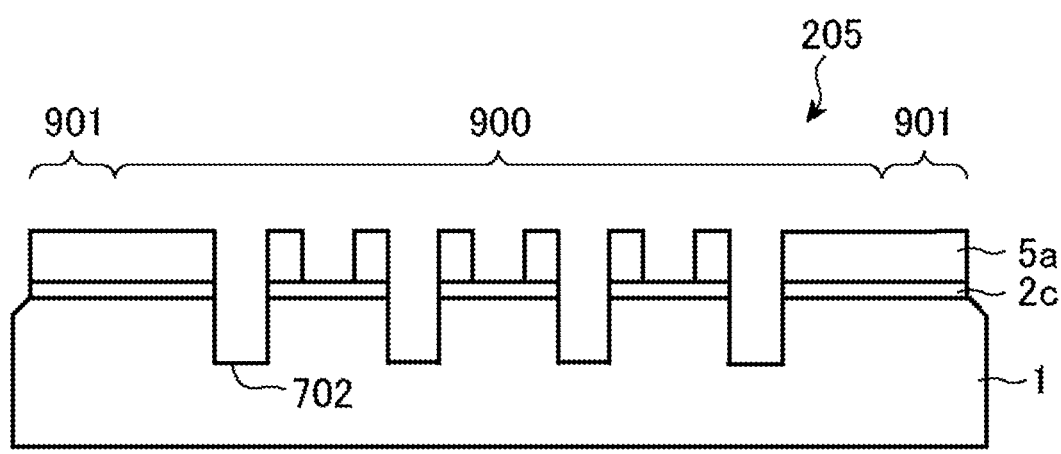
FIG. 11 is a cross-sectional view illustrating a configuration of a phase shift mask according to another embodiment.

The phase shift mask 205 according to another embodiment (see FIG. 11) has a configuration where a light shielding pattern 5a is formed on the light shielding film 5 of the mask blank 105, a dug part where the surface is dug to a predetermined depth and a light transmitting part that is not dug are provided on the pattern forming region 900 of the transparent substrate 1 where the pattern of the light shielding film 5 is removed, and the etching stopper pattern 2c which is a pattern that is removed only in the region above the dug part is formed on the etching stopper film 2. With the phase shift mask 205, the digging depth of the transparent substrate 1 and the optical properties and film thickness of the etching stopper film 2 are adjusted so that a predetermined phase difference occurs between the exposure light that transmits through the dug part and the exposure light that transmits through the light transmitting part. Note that in the case of the configuration where the hard mask film 6 is provided on the mask blank 105, the hard mask film 6 is removed during the process of fabricating the phase shift mask 205 (see FIGS. 12A-H).

Hereinafter, the method for manufacturing the phase shift mask 205 according to another embodiment will be described while following the manufacturing steps illustrated in FIGS. 12A to 12H, which are cross-sectional structure views of a main component. Note that the method for manufacturing the phase shift mask 205 that uses the mask blank 105, in which hard mask film 6 is laminated onto light shielding film 5, will be described here. Furthermore, the case in which a material containing a transition metal and silicon is used in the light shielding film 5 and a material containing chromium is used in the hard mask film 6 will be described. The details of the etching gas and the like are the same as in the first embodiment.

First, a resist film is formed in contact with hard mask film 6 in mask blank 101 by a spin coating method. Next, a light shielding pattern to be formed on the light shielding film 5 is written by an electron beam onto the resist film, and a first resist pattern 7a is formed by further performing a predetermined treatment such as a developing process or the like (see FIG. 12A). Subsequently, the first hard mask pattern 6a is formed on the hard mask film 6 by performing first dry etching with a mixed gas containing a chlorine-based gas and oxygen gas using the first resist pattern 7a as a mask (see FIG. 12B).

Figure 12A:
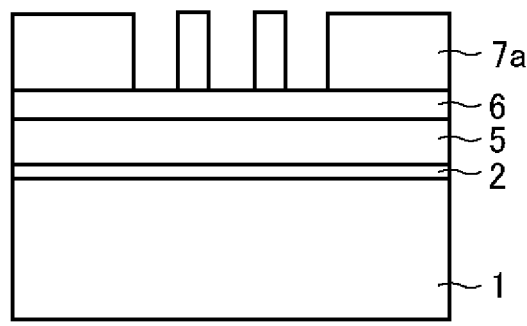
FIGS. 12A to 12H are cross-sectional schematic views illustrating manufacturing steps for a phase shift mask according to another embodiment.
Figure 12B:
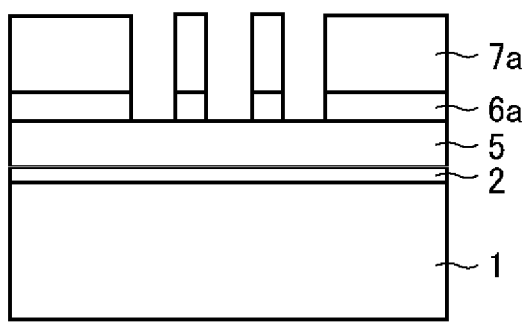
Figure 12C:
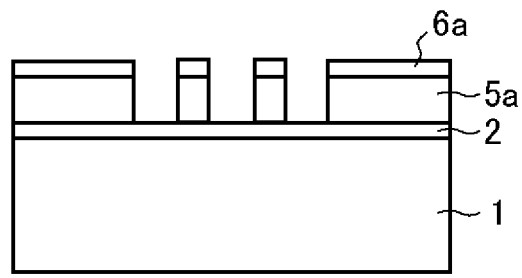

Next, after removing resist pattern 7a, the first light shielding pattern 5a is formed on the light shielding film 5 by performing second dry etching with a fluorine-based gas using hard mask pattern 6a serving as a mask (see FIG. 12C). The hard mask pattern 6a has a film thickness that is made thinner than the film thickness prior to dry etching by performing a second dry etching.

During dry etching of this light shielding film 5 with a fluorine-based gas, additional etching (over-etching) is performed to increase the verticality of the pattern side walls of light shielding pattern 5a and increase the in-plane CD (Critical Dimension) uniformity of the light shielding pattern 5a. Even after such over-etching, the surface of etching stopper film 2 is only minutely etched, with the surface of transparent substrate 1 not exposed in the surface 700 of the light transmitting part of the light shielding pattern 5a.

Figure 12D:
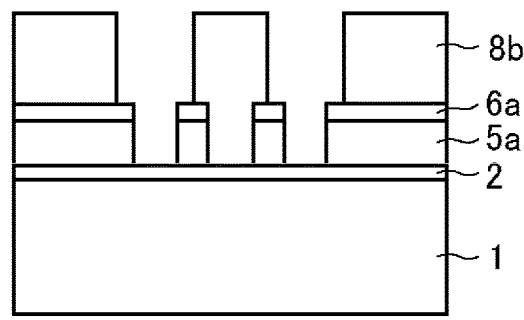
Figure 12E:
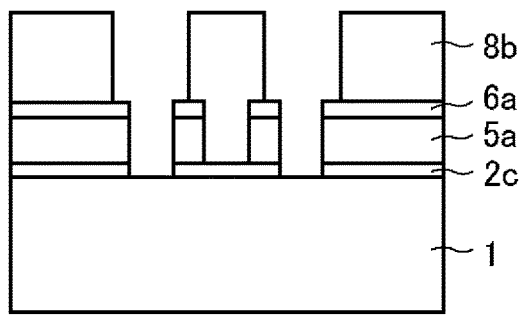
Figure 12F:
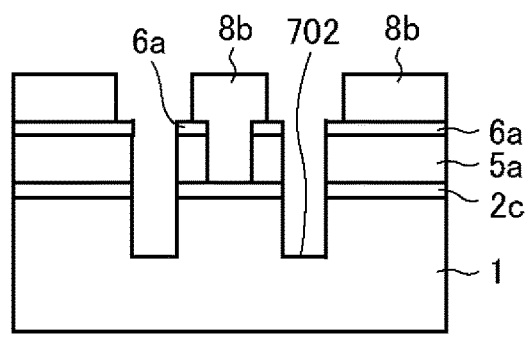
Figure 12G:
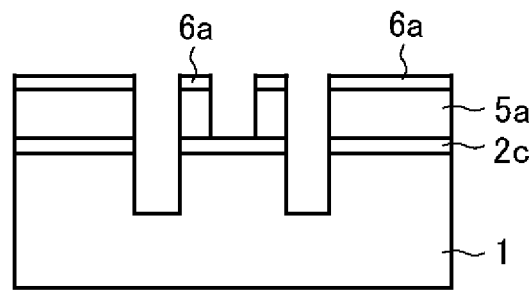

Subsequently, a resist film is formed by a spin coating method, and then writing by an electron beam is performed onto the resist film, and a second resist pattern 8b is formed by further performing a predetermined treatment such as a developing process or the like (see FIG. 12D).

Subsequently, the second resist pattern 8b is formed in order to form the etching stopper pattern 2c and the dug part 702 (see FIG. 12D). Subsequently, an etching stopper pattern 2c is formed on the etching stopper film 2 by performing dry etching using a mixed gas containing boron chloride ($BCl_3$) and chlorine ($Cl_2$) (see FIG. 12E). Subsequently, the dug part 702 is formed by digging the transparent substrate 1 to a predetermined depth from the surface performing dry etching using a fluorine-based gas such as $CF_4$ or the like (see FIG. 12F).

Figure 12H:
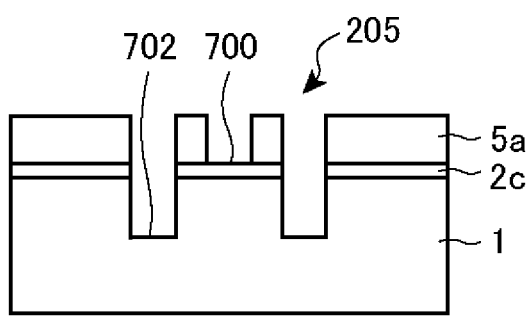

Subsequently, the second resist pattern 8b is removed by ashing or by using a peeling solution or the like (see FIG. 12G), and then the hard mask pattern 6a remaining on the light shielding pattern 5a is removed (see FIG. 12H). Removal of the hard mask pattern 6a can be performed by dry etching using a mixed gas containing a chlorine-based gas and oxygen gas.

Subsequently, a cleaning step is performed, and then a mask defect inspection is performed as necessary. Furthermore, defect repair is performed as necessary depending on the results of the defect inspection, and thereby the phase shift mask 205 is manufactured. Ammonia-hydrogen peroxide was used in the cleaning step, but the surface of etching stopper film 2 is hardly dissolved, so the surface of the transparent substrate 1 is not exposed at the light transmitting part (the surface 700) of the etching stopper pattern 2c.

The phase shift mask 205 of another embodiment was fabricated using the aforementioned mask blank 105. Therefore, with the phase shift mask 205 of another embodiment, the side walls of light shielding pattern 5a have high verticality and the light shielding pattern 5a also has high in-plane CD uniformity. Furthermore, when black defects are discovered in the light shielding pattern 5a during the process of manufacturing the phase shift mask 205 and the black defects are repaired by EB defect repair, the black defects can be accurately repaired because the etching stopper function is enhanced and the etching endpoints are easy to detect.

[Manufacture of Semiconductor Device]

The method for manufacturing a semiconductor device of another embodiment is featured in that the transfer pattern is transferred by exposure to the resist film on the semiconductor substrate using the phase shift mask 205 of another embodiment or the phase shift mask 205 manufactured using the mask blank 105 of this other embodiment. Therefore, with the phase shift mask 205 of another embodiment, the side walls of the light shielding pattern 5a have high verticality and the light shielding pattern 5a also has high in-plane CD uniformity. For this reason, transferring by exposure to resist films on semiconductor devices using phase shift mask 205 according to another embodiment allows circuit patterns to be formed on the resist films of the semiconductor devices with sufficient accuracy sufficient to satisfy design specifications.

Furthermore, even when exposure transfer to resist film in a semiconductor device is carried out using a phase shift mask whose black defect portions existing in the light shielding pattern 5a have been repaired by EB defect repair during the process of manufacturing, the black defects are repaired with high accuracy and the occurrence of transfer failure can be prevented in the resist films of the semiconductor devices corresponding to the light shielding pattern 5a areas in which the black defects of the phase shift mask exists. For this reason, in a case where circuit patterns are formed by performing dry etching the film to be processed using these resist patterns as a mask to, circuit patterns can be formed with high accuracy and high yield without shortcuts and disconnection of wires due to insufficient accuracy or transfer defects.

EXAMPLES

Hereinafter, embodiments of the present invention will be described more specifically by way of examples.

Example 1

[Manufacture of Mask Blank]

Transparent substrate 1 was prepared having main surface dimensions of approximately 152 mm×approximately 152 mm and made of a synthetic quartz glass with a thickness of approximately 6.35 mm. This transparent substrate 1 had been polished to a predetermined surface roughness or less (a root mean square roughness Rq of 0.2 nm or less) at the end surfaces and the main surface, then subjected to a predetermined cleaning treatment and drying treatment.

Next, etching stopper film 2 (AlSiO film) made of aluminum, silicon, and oxygen was formed to a thickness of 10 nm in contact with the surface of transparent substrate 1. Specifically, transparent substrate 1 was placed in a single-wafer RF sputtering device and etching stopper film 2 was formed by a sputtering (RF sputtering) that made an $Al_2O_3$ target and $SiO_2$ target simultaneously discharge with argon (Ar) gas serving as the sputtering gas. X-ray photoelectron spectroscopy analysis of an etching stopper film formed on another transparent substrate under the same conditions found that Al:Si:O=21:19:60 (atom % ratio). In other words, Si/[Si+Al] for this etching stopper film 2 is 0.475. Note that in the X-ray photoelectron spectroscopy analysis, numerical values have been adjusted based on the results of RBS analysis (analysis by Rutherford backscattering spectrometry) (the same applies to the analyses below).

Furthermore, measurements of the respective optical characteristics of the etching stopper film 2 using a spectral ellipsometer (M-2000D available from J. A. Woollam) determine that a refractive index n of 1.625 and an extinction coefficient k of 0.000 (measurement lower limit) for light having a wavelength of 193 nm.

Next, phase shift film 3 made of $SiO_2$ containing silicon and oxygen was formed to a thickness of 173 nm, in contact with the surface of etching stopper film 2. Specifically, a transparent substrate 1 on which an etching stopper film 2 was formed was placed in a single-wafer RF sputtering device, and a phase shift film 3 with a film thickness of 173 nm made of $SiO_2$ is formed on the etching stopper film 2 by RF sputtering using silicon dioxide ($SiO_2$) as a target, Argon (Ar) gas (pressure=0.03 Pa) serving as the sputtering gas, and a power of the RF power supply of 1.5 kW. Note that only the phase shift film 3 made of SiO2 was formed under the same conditions on the main surface of the other transparent substrate, and when measuring the optical characteristics of the uppermost layer using the aforementioned spectral ellipsometer, the refractive index n was 1.563 and the extinction coefficient k was 0.0000 (measurement lower limit) with respect to light having a wavelength of 193 nm.

Then, the light shielding film 5 containing chromium was formed at a thickness of 59 nm, in contact with the surface of the phase shift film 3. The light shielding film 5 is a CrOC film containing oxygen and carbon, in addition to chromium. Specifically, the transparent substrate 1 on which a phase shift film 3 was formed was place in a single-wafer DC sputtering device and the light shielding film 5 was formed by reactive sputtering (DC sputtering) using a chromium (Cr) target, using a mixed gas atmosphere containing carbon dioxide ($CO_2$), and helium (He).

Next, heat treatment was performed on the transparent substrate 1 with a light shielding film 5 (CrOC film) formed therein. Specifically, the heat treatment was performed in air using a hot plate at a heating temperature of 280° C. and a heating time of 5 minutes.

Analysis of the heat treated light shielding film 5 was performed using X-ray photoelectron spectroscopy (with ESCA and RBS correction). As a result, the region near the surface on the opposite side to the side of the transparent substrate 1 of the light shielding film 5 (region from the surface to a depth of approximately 2 nm) was confirmed to have a composition gradient where the oxygen content was higher than in other regions (oxygen content was 40 atom % or more). Furthermore, the amount of each component element in the regions excluding the composition gradient part of the light shielding film 5 was found to be on average, Cr: 71 atom %, O: 15 atom %, and C: 14 atom %. Furthermore, the difference in the component elements in the thickness direction of the regions excluding the composition gradient region in the light shielding film 5 were all 3 atom % or less, and the composition gradient in the thickness direction was confirmed to be essentially nonexistent.

Note that the compositions of other films shown below were measured by X-ray photoelectron spectroscopy (with ESCA and RBS correction), similar to the light shielding film 5.

Furthermore, the optical density (OD) at the wavelength of the ArF Excimer laser light (approximately 193 nm) was measured for the heat treated light shielding film 5 using a spectrophotometer (Cary 4000 available from Agilent Technologies) and was confirmed to be 3.0 or more.

Next, phase shift film 6 made of $SiO_2$ containing silicon and oxygen was formed to a thickness of 12 nm, in contact with the surface of the light shielding film 5. Specifically, the transparent substrate 1 on which the light shielding film 5 was formed was placed in a single-wafer RF sputtering device, and a hard mask film 6 made of $SiO_2$ with a film thickness of 12 nm was formed on the light shielding film 5 by RF sputtering using silicon dioxide ($SiO_2$) as a target, Argon (Ar) gas (pressure=0.03 Pa) serving as the sputtering gas, and a power of the RF power supply of 1.5 kW. A mask blank of Example 1 was manufactured by the above procedures.

Note that when the transmittance of the etching stopper film 2 formed on another transparent substrate was performed at the wavelength of the ArF excimer laser (193 nm) by the aforementioned phase shift measurement device, the transmittance was found to be 98.3%, assuming the transmittance of the transparent substrate is 100%, and the influence of the decrease in transmittance caused by providing the etching stopper film 2 of this Example 1 was small. Furthermore, the etching rate of the transparent substrate 1 on which an etching stopper film 2 had been formed was measured immersing it in ammonia water having a concentration of 0.5%, which was found to be 0.1 nm/min. These results confirmed that the etching stopper film 2 of Example 1 has sufficient resistance to chemical cleaning performed during the process of manufacturing phase shift masks from mask blanks.

Dry etching was performed under the same conditions using a $CF_4$ etching gas on the transparent substrate 1, etching stopper film 2 formed on another transparent substrate 1, and a phase shift film 3 formed on yet another transparent substrate 1. Then, the respective etching rates were calculated and the etching selective ratios were compared. The etching selective ratio of the etching stopper film 2 of Example 1 with regard to the etching rate of the phase shift film 3 was 0.11. On the other hand, the etching selective ratio of the transparent substrate 1 used in Example 1 with regard to the etching rate of the phase shift film 3 was essentially 1, and thus it was confirmed that the etching stopper film 2 of Example 1 had sufficiently high etching stopper function.

[Manufacture and Evaluation of Phase shift mask]

Next, the phase shift mask 201 of Example 1 was fabricated using the mask blank 101 of Example 1 by the following procedures. First, the surface of the hard mask film 6 was subjected to HMDS treatment. Subsequently, a resist film made of a chemically amplified resist for electron beam lithography was formed to a film thickness of 80 nm in contact with the surface of hard mask film 6 by the spin coating method. Next, writing was performed to the resist film by an electron beam and the resist pattern 7a was formed by performing predetermined developing process (see FIG. 3A).

Next, the hard mask pattern 6a was formed on the hard mask film 6 by performing dry etching with $CF_4$ gas using the first resist pattern 7a as a mask (see FIG. 3B).

Next, the first resist pattern 7a was removed by TMAH. Subsequently, a first light shielding pattern 5a was formed on the light shielding film 5 by performing dry etching with a mixed gas containing chlorine and oxygen (gas flow ratio $Cl_2:O_2=4:1$) using the hard mask pattern 6a as a mask (see FIG. 3C).

Next, HMDS treatment was performed on the mask blank with a thin film hard mask pattern 6a, and a process that enhances the adhesion to the resist was performed by hydrophobizing the surface of the hard mask pattern 6a. Subsequently, a resist film made of a chemically amplified resist for electron beam lithography was formed to a film thickness of 300 nm in contact with the surface of the hard mask pattern 6a and the surface of the phase shift film 3 that was exposed on the surface, by the spin coating method. Next, the second resist pattern 8b was formed by performing electron beam writing on the resist film and a predetermined developing process (see FIG. 3D). Herein, programmed defects, in addition to the phase shift patterns that were to be originally formed, were added in the second resist pattern 8b such that black defects were formed on the phase shift film.

Figure 3E:
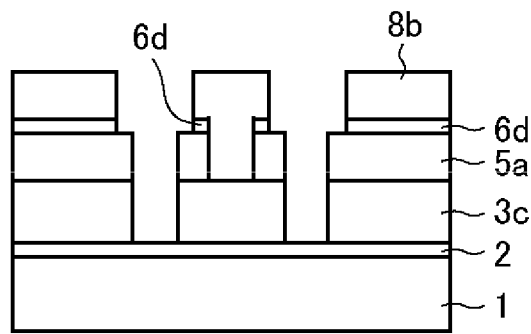
Figure 3F:
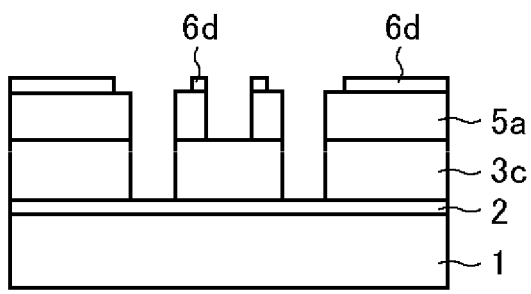
Figure 3G:
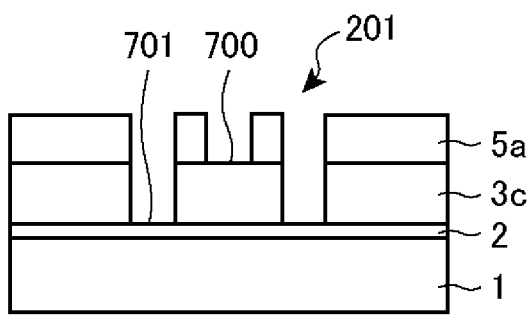

Next, the phase shift pattern 3c was formed on the phase shift film 3 by performing dry etching using $CF_4$ gas using the second resist pattern 8b and the light shielding pattern 5a as masks (see FIG. 3E). In the initial stage of etching, the hard mask pattern 6a that was formed on the light shielding pattern 5a also acts as an etching mask, but the materials of the hard mask and the material of the phase shift film 3 are $SiO_2$ similarly, so the hard mask pattern 6a becomes the hard mask pattern 6d where a portion of the pattern is eliminated by etching at an early stage.

With this dry etching of the phase shift film 3 using a fluorine-based gas ($CF_4$ gas), in addition to the etching time from the start of the etching of phase shift film 3 until the surface of etching stopper film 2 began to be exposed, with the etching progressing in the thickness direction of phase shift film 3 (just etching time), additional etching (over-etching) was performed for a period of time that was 20% of the just etching time (over-etching time). Note that this dry etching with a fluorine-based gas was performed under so-called high bias conditions where a bias power of 25 W was applied.

Next, the second resist pattern 8b was removed by ashing. However, removing by TMAH instead of removal by ashing is also possible. Subsequently, the hard mask pattern 6d was removed by dry etching using a fluorine-based gas ($CF_4$).

A Levenson phase shift mask 201 fabricated in Example 1 was inspected for mask pattern with a mask inspection device, and defects were found on the phase shift pattern 3c at the locations where the programmed defects had been arranged. Upon performing EB defect repair with respect to the defect parts using an electron beam and $XeF_2$ gas, etching endpoints were easily detected and etching in the surface of etching stopper film 2 was minimized.

A Levenson type phase shift mask was manufactured by similar procedures using another mask blank fabricated by the method of Example 1, and the in-plane CD uniformity of the phase shift pattern was inspected, yielding good results. Furthermore, STEM observation of a cross section of the phase shift pattern revealed that the side walls of the phase shift pattern had high verticality and the etching stopper film had been minutely dug into by less than 1 nm, with no microtrenches generated. Therefore, the Levenson type phase shift mask of Example 1 can be said to have high in-plane uniformity for the phase shift effect. Furthermore, it can be seen that a Levenson type phase shift mask with high in-plane uniformity for the phase shift effect can be manufactured from the mask blank of Example 1.

With respect to the Levenson type phase shift mask 201 of Example 1 on which EB defect repair was performed, a simulation of transfer images transferred by exposure to a resist film on a semiconductor device with an exposure light having a wavelength of 193 nm was performed using AIMS 193 (available from Carl Zeiss). Verification of the images transferred by exposure in this simulation revealed that the design specifications were sufficiently satisfied. The influence of the decreased transmittance at light transmissive portions due to the provision of etching stopper film 2 against exposure transfer was minute. Furthermore, the transfer images of the portions in which EB defect repair had been performed compared favorably with transfer images of other regions. From these results, one could argue that even in a case where the Levenson type phase shift mask of Example 1 on which EB defect repair had been performed was placed on the mask stage of an exposure apparatus and transferred by exposure to a resist film on a semiconductor device, the final circuit pattern formed on the semiconductor device could be formed with high accuracy.

Example 2

[Manufacture of Mask Blank]

The mask blank of this Example 2 was manufactured in a similar manner to the mask blank of Example 1 except for the material composition of the etching stopper film 2. Therefore, the structure of the laminated mask blank where the etching stopper film 2, phase shift film 3, and light shielding film 5 were laminated in this order on the transparent substrate 1, as well as the material of the transparent substrate 1, phase shift film 3, and the light shielding film 5 and the manufacturing method were the same as in Example 1. Hereinafter, differing points from the mask blank of Example 1 will be described.

The etching stopper film 2 of Example 2 was an AlSiO film formed by placing a transparent substrate 1 in a single-wafer type RF sputtering device, simultaneously discharging the $Al_2O_3$ target and the $SiO_2$ target, and then RF sputtering using argon gas serving as the sputtering gas, where the elemental ratio was such that Al:Si:O=13:26:61 (atom % ratio). Therefore, Si/[Si+Al] for this etching stopper film 2 was 0.67. The etching stopper film 2 was formed to a thickness of 10 nm in contact with the surface of the transparent substrate 1. Furthermore, when the optical coefficient of the etching stopper film 2 was measured using a spectroscopic ellipsometer, the refractive index n was 1.600 and the extinction coefficient k was 0.0000 (measurement lower limit) for light with a wavelength of 193 nm.

When the transmittance of the etching stopper film 2 was measured at the wavelength of an ArF excimer laser (193 nm) similarly as in Example 1, the transmittance was 99.4%, assuming the transmittance of the transparent substrate 1 was 100%, and reduction in the transmittance due to inclusion of the etching stopper film 2 of Example 2 was minimal. Furthermore, the etching rate of the transparent substrate on which an etching stopper film 2 was formed was measured immersing it in ammonia water having a concentration of 0.5%, which was found to be 0.1 nm/min. These results confirmed that the etching stopper film 2 of Example 2 has sufficient resistance to chemical cleaning performed during the process of manufacturing the phase shift mask.

Furthermore, the etching selective ratio of the etching stopper film 2 of Example 2 was evaluated with regard to the etching rate of the phase shift film 3 during dry etching using a $CF_4$ etching gas by the same method as in Example 1, which was found to be 0.24, and thus the etching stopper film 2 of Example 2 had sufficiently high etching stopper function for practical use.

[Manufacture and Evaluation of Phase Shift Mask]

Next, phase shift mask 201 of Example 2 was fabricated using mask blank 101 of Example 2 by procedures similar to those of Example 1. Upon performing EB defect repair with respect to the programmed defect parts provided in the phase shift pattern 3c, using an electron beam and $XeF_2$ gas, etching endpoints were easily detected and etching in the surface of etching stopper film 2 was minimized.

Furthermore, the phase shift mask 201 that was manufactured had high in-plane CD uniformity of the phase shift pattern 3c and high verticality of the side walls, digging into the etching stopper film 2 was minute at less than 1 nm, and microtrenches were not generated. When simulation of an exposure light transfer image using the phase shift mask was performed using AIMS 193, the design specification was sufficiently satisfied, including the areas where EB defect repair was performed.

Example 3

The mask blank of this Example 3 was manufactured in a similar manner to the mask blank of Example 1 except for the material composition of the etching stopper film 2. Therefore, the structure of the laminated mask blank where the etching stopper film 2, phase shift film 3, and light shielding film 5 were laminated in this order on the transparent substrate 1, as well as the material of the transparent substrate 1, phase shift film 3, and the light shielding film 5 and the manufacturing method were the same as in Example 1. Hereinafter, differing points from the mask blank of Example 1 will be described.

The etching stopper film 2 of Example 3 was an AlSiO film formed by placing a transparent substrate 1 in a single-wafer type RF sputtering device, simultaneously discharging the $Al_2O_3$ target and the $SiO_2$ target, and then RF sputtering using argon gas serving as the sputtering gas, where the elemental ratio was such that Al:Si:O=7:28:65 (atom % ratio). Therefore, Si/[Si+Al] for this etching stopper film 2 was 0.8. The etching stopper film 2 was formed to a thickness of 10 nm in contact with the surface of the transparent substrate 1. Furthermore, when the optical coefficient of the etching stopper film 2 was measured using a spectroscopic ellipsometer, the refractive index n was 1.589 and the extinction coefficient k was 0.0000 (measurement lower limit) for light with a wavelength of 193 nm.

When the transmittance of the etching stopper film 2 was measured at the wavelength of an ArF excimer laser (193 nm) by the aforementioned phase shift measurement device, the transmittance was 99.8%, assuming the transmittance of the transparent substrate 1 was 100%, and the reduction in the transmittance due to providing the etching stopper film 2 of Example 3 was minimal. Furthermore, the etching rate of the transparent substrate on which an etching stopper film 2 was formed was measured immersing it in ammonia water having a concentration of 0.5%, which was found to be 0.1 nm/min. These results confirmed that the etching stopper film 2 of Example 3 has sufficient resistance to chemical cleaning performed during the process of manufacturing the phase shift mask.

Furthermore, the etching selective ratio of the etching stopper film 2 of Example 3 was evaluated with regard to the etching rate of the phase shift film 3 during dry etching using a $CF_4$ etching gas by the same method as Example 1, and was found to be 0.42, and thus the etching stopper film 2 of Example 3 had high etching stopper function to withstand practical use.

[Manufacture and Evaluation of Phase Shift Mask]

Next, phase shift mask 201 of Example 3 was fabricated using mask blank 101 of this Example 3 by procedures similar to those of Example 1. Upon performing EB defect repair with respect to the programmed defect parts provided in the phase shift pattern 3c, using an electron beam and $XeF_2$ gas, etching endpoints were easily detected and etching in the surface of etching stopper film 2 was minimized.

Furthermore, the phase shift mask 201 that was manufactured had high in-plane CD uniformity and high verticality of the side walls of the phase shift pattern 3c, digging into the etching stopper film 2 was minute at less than 1 nm, and microtrenches were not generated. When simulation of an exposure light transfer image using the phase shift mask was performed using AIMS 193, the design specification was sufficiently satisfied, including the areas where EB defect repair was performed.

Example 4

[Manufacture of Mask Blank]

The mask blank of this Example 4 was manufactured in a similar manner to the mask blank of Example 1 except for the material composition of the etching stopper film 2. Therefore, the structure of the mask blank where the etching stopper film 2, phase shift film 3, and light shielding film 5 were laminated in this order on the transparent substrate 1, as well as the material of the transparent substrate 1, phase shift film 3, and the light shielding film 5 and the manufacturing method were the same as in Example 1. Hereinafter, differing points from the mask blank of Example 1 will be described.

The etching stopper film 2 of Example 4 was an AlSiO film formed by placing a transparent substrate 1 in a single-wafer type RF sputtering device, simultaneously discharging the $Al_2O_3$ target and the $SiO_2$ target, and then RF sputtering using argon gas serving as the sputtering gas, where the elemental ratio was such that Al:Si:O=31:8:61 (atom % ratio). Therefore, Si/[Si+Al] for this etching stopper film 2 was 0.20. The etching stopper film 2 was formed to a thickness of 10 nm in contact with the surface of the transparent substrate 1. Furthermore, when the optical coefficient of the etching stopper film 2 was measured using a spectroscopic ellipsometer, the refractive index n was 1.720 and the extinction coefficient k was 0.0328 for light with a wavelength of 193 nm.

The transmittance of the etching stopper film 2 measured at the wavelength of an ArF excimer laser (193 nm) by the same method as in Example 1 was 95.2%, assuming the transmittance of the transparent substrate 1 was 100%, and the reduction in the transmittance due to providing the etching stopper film 2 of Example 4 was found to be within a range that could withstand practical use. Furthermore, the etching rate of the transparent substrate on which an etching stopper film 2 was formed was measured immersing it in ammonia water having a concentration of 0.5%, which was found to be 0.2 nm/min. These results confirmed that the etching stopper film 2 of Example 4 has sufficient resistance to chemical cleaning performed during the process of manufacturing the phase shift mask.

Furthermore, the etching selective ratio of the etching stopper film 2 of Example 4 was evaluated with regard to the etching rate of the phase shift film 3 during dry etching using a $CF_4$ etching gas by the same method as in Example 1, and was found to be 0.035, and thus the etching stopper film 2 of Example 4 had sufficiently high etching stopper function.

[Manufacture and Evaluation of Phase Shift Mask]

Next, phase shift mask 201 of Example 4 was fabricated using mask blank 101 of Example 4 by procedures similar to those of Example 1. Upon performing EB defect repair with respect to the programmed defect parts provided in the phase shift pattern 3c, using an electron beam and $XeF_2$ gas, etching endpoints were easily detected and etching in the surface of etching stopper film 2 was minimized.

Furthermore, the phase shift mask 201 that was manufactured had high in-plane CD uniformity and high verticality of the side walls of the phase shift pattern 3c, digging into the etching stopper film 2 was minute at less than 1 nm, and microtrenches were not generated. When simulation of an exposure light transfer image using the phase shift mask was performed using AIMS 193, the design specification was sufficiently satisfied, including the areas where EB defect repair was performed.

Example 5

[Manufacture of Mask Blank]

The mask blank 101 of Example 5 is an example corresponding to Embodiment 2, and has a structure of the mask blank where the etching stopper film 2, phase shift film 3, and light shielding film 5 are laminated in this order on the transparent substrate 1, Furthermore, a hard mask film 6 made of CrN is formed on the light shielding film 5. Herein, the material and manufacturing method of the transparent substrate 1, etching stopper film 2, and phase shift film 3 were the same as in Example 1, but the light shielding film 5 and the hard mask film 6 were different from Example 1. The light shielding film 5 of Example 5 was made of a material containing Si with a laminate structure including a lower layer of MoSiN and an upper layer of MoSiN. Hereinafter, differing points from the mask blank of Example 1 will be described for the mask blank of Example 5.

The light shielding film 5 of Example 5 is a laminate structure film including a lower layer MoSiN layer and an upper layer MoSiN layer as described above, but the laminate film was fabricated as described below. Herein, the lower layer MoSiN layer mainly has an exposure light absorbing function (light shielding function), and the upper layer MoSiN layer has a function of preventing surface reflection toward the exposure light and the mask pattern defect inspection light.

The MoSiN layer (lower layer (light shielding layer)) is formed on the phase shift layer 3 with a thickness of 47 nm, and then the MoSiN layer (upper layer (surface reflection preventing layer)) is formed at a film thickness of 4 nm, and thereby the light shielding film 5 (total film thickness 51 nm) for ArF Excimer laser (wavelength 193 nm) was formed. Specifically, the transparent substrate 1 with a phase shift film 3 formed thereon was placed in a single-wafer type sputtering device, and a MoSiN film (lower layer (light shielding layer)) was formed to a thickness of 47 nm by reactive sputtering (DC sputtering) in a mixed gas atmosphere containing argon and nitrogen, using a mixed target containing molybdenum (Mo) and silicon (Si) as the sputtering target (atom % ratio Mo:Si=13:87), and then a MoSiN film (upper layer (surface reflection preventing layer)) was formed to a film thickness of 4 nm in a mixed gas atmosphere containing argon or nitrogen using a Mo/Si target (atom % ratio Mo:Si=13:87).

Next, a procedure for reducing the film stress of light shielding film 5 was performed by performing heating treatment (annealing) at 450° C. for 30 minutes on the transparent substrate 1 on which the light shielding film 5 was formed. Note that a substrate with a light shielding film 5 was manufactured by the same procedures up to the annealing treatment, and when analysis was performed using X-ray photoelectron spectroscopy (ESCA) (where the analysis values were RBS corrected), it was confirmed that the lower layer had a film composition of Mo: 9.2 atom %, Si: 68.3 atom %, N: 22.5 atom %, and the upper layer near the lower layer side had a film composition of Mo: 5.8 atom %, Si: 64.4 atom %, N: 27.7 atom %, O: 2.1 atom %. Note that the results of the X-ray photoelectron spectroscopy (ESCA) of the surface layer of the upper layer showed that nitrogen accounted for 14.4 atom % and oxygen accounted for 38.3 atom %. Furthermore, the refractive index n of the lower layer of the light shielding film 5 toward light with a wavelength of 193 nm was 1.88, and the extinction coefficient k was 2.20. The refractive index n of the upper layer was 2.07, and the extinction coefficient k was 1.14. The optical density (OD) of the light shielding film 5 was 3.0, and thus the light shielding film 5 includes a function to sufficiently shield ArF Excimer laser light.

A light shielding film 5 was fabricated, and then a hard mask film 6 (CrN film) made of chromium and nitrogen was formed to a thickness of 5 nm in contact with the surface of the upper layer of the light shielding film 5. Specifically, transparent substrate 1 provided up to the heat treated light shielding film 5 was placed in a single-wafer DC sputtering device, and a hard mask film 6 was formed by reactive sputtering (DC sputtering) in which a chromium (Cr) target was used and a mixed gas containing argon (Ar) and nitrogen ($N_2$) was used serving as the sputtering gas. X-ray photoelectron spectroscopy analysis of a hard mask film formed on another transparent substrate under the same conditions found that Cr:N=72:28 (atom % ratio). A mask blank of Example 5 was manufactured by the above procedures.

[Manufacture and Evaluation of Phase Shift Mask]

Next, phase shift mask 201 of Example 5 was fabricated using mask blank 101 of Example 5 by procedures similar to those of Example 1. The points that differ from Example 1 with regard to the manufacturing process are only the processes related to the light shielding film 5 and the hard mask film 6, and therefore the explanation will focus on these points.

In Example 5, a hard mask pattern 6a was formed using the light shielding pattern 5a on the hard mask film 6 by dry etching with a mixed gas containing chlorine and oxygen (gas flow ratio $Cl_2:O_2$=4:1) (see FIG. 3B).

Furthermore, a light shielding pattern 5a was formed on the light shielding film 5 using the hard mask pattern 6a as the etching mask by dry etching using a fluorine-based gas (mixed gas containing $SF_6$ and He) (see FIG. 3C). Note that this dry etching with a fluorine-based gas was carried out under so-called high bias conditions with a bias power of 10 W applied.

In the hard mask pattern 6d removal step (see FIG. 3G), the hard mask pattern 6d was removed by dry etching using a mixed gas containing chlorine-based gas and oxygen gas (gas flow ratio $Cl_2:O_2$=4:1). All other steps conformed to the process of Example 1.

The phase shift mask 201 fabricated by Example 5 was formed with an etching stopper film 2 including an AlSiO film on the transparent substrate 1, and therefore similar effects to the phase shift mask 201 of Example 1 were exhibited. In other words, the in-plane CD uniformity and verticality of the side walls of the phase shift pattern 3c were high, digging into the etching stopper film 2 was minute at less than 1 nm, and microtrenches were not generated. Furthermore, defects in the phase shift pattern 3c could be highly accurately repaired by EB defect repair. The chemical washing resistance was similar to that of Example 1, and problems with pattern peeling or the like due to chemical washing were not observed. When simulation of an exposure light transfer image using the phase shift mask was performed using AIMS 193, the design specification was sufficiently satisfied, including the areas where EB defect repair was performed.

Example 6

[Manufacture of Mask Blank]

Figure 4:
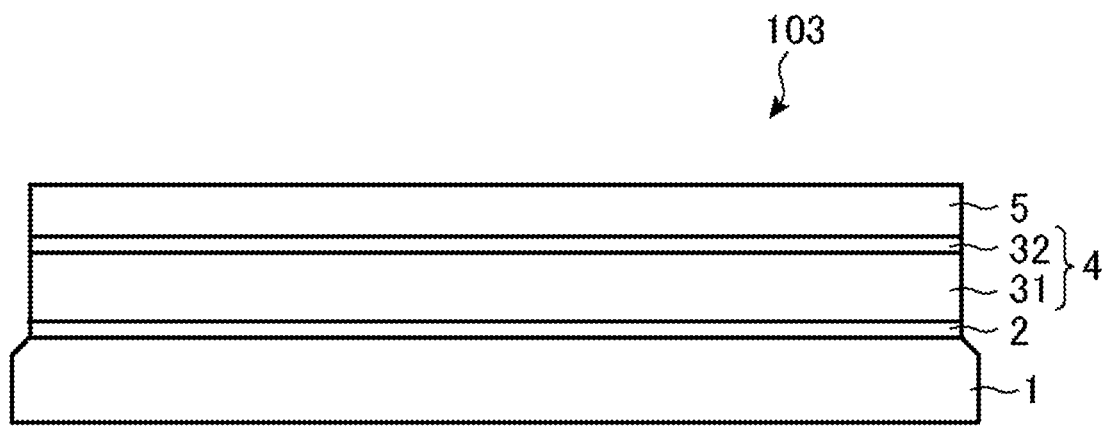
FIG. 4 is a cross-sectional view illustrating a configuration of a mask blank according to a third embodiment and a fourth embodiment of the present invention.

The mask blank 103 of Example 6 is an example corresponding to Embodiment 3, and has a structure of the mask blank where the etching stopper film 2, lower layer 31, upper layer 32 which has an etching stopper function, and a light shielding film 5 were laminated in this order on the transparent substrate 1 (see FIG. 4). Furthermore, a hard mask film 6 was formed on the light shielding film 5. The material and the manufacturing method of the transparent substrate 1, etching stopper film 2, lower layer 31, light shielding film 5, and hard mask film 6 were similar to those in Example 1. The difference from those in Example 1 was the film thickness of the lower layer 31, and the introduction of the upper layer 32 made of AlSiO and having an etching stopper function. Hereinafter, differing points from the mask blank of Example 1 will be described for the mask blank of Example 6.

The lower layer 31 made of $SiO_2$ containing silicon and oxygen was formed to a thickness of 166 nm, in contact with the surface of etching stopper film 2. The film forming conditions were the same as in Example 1, and the film thickness was achieved by controlling the film forming time. Film forming was performed under the same conditions as Example 1, so similar to Example 1, the refractive index n for 193 nm wavelength light of the lower layer 31 was 1.563, and the extinction coefficient k was 0.0000 (measurement lower limit).

Subsequently, upper layer 32 (AlSiO film) made of aluminum, silicon, and oxygen with an etching stopper function was formed to a thickness of 5 nm in contact with the surface of the surface of the lower layer 31. The film forming conditions were the same as in the etching stopper film 2, and the composition of the component elements was also the same as the etching stopper film 2, so Al:Si:O=21:19:60 (atom % ratio), and Si/[Si+Al] was 0.475. The upper layer 32 with a portion of the phase shift function forms the phase shift film 4 of the laminate structure that inverts the phase of the exposure light together with the lower layer 31.

The upper layer 32 is a film with the same composition as the etching stopper film 2, and the results of Example 1 show that the upper layer 32 of Example 6 has sufficient resistance to chemical washing that is performed in the process of manufacturing the phase shift mask from the mask blank. The upper layer 32 is responsible for a phase shift function, and therefore having sufficient resistance to chemical washing is very important from the perspective of increasing the phase control.

[Manufacture and Evaluation of Phase Shift Mask]

Next, phase shift mask 203 of Example 6 was fabricated using mask blank 103 of Example 6 by procedures similar to those of Example 1. The points that differ from Example 1 with regard to the manufacturing process are only the processes related to the upper layer 32 and the hard mask film 6, and therefore the explanation will focus on these points.

Figure 6C:
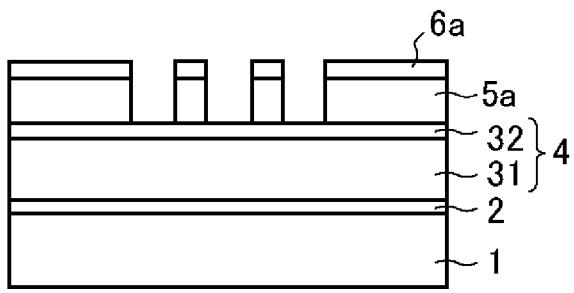
Figure 6D:
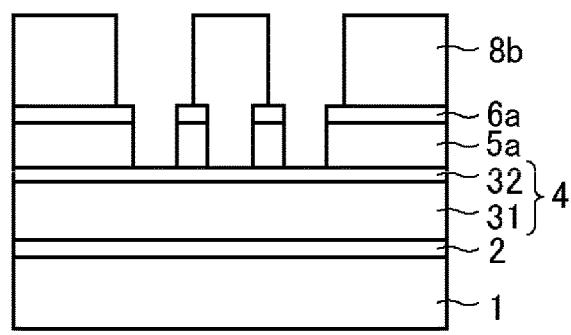
Figure 6E:
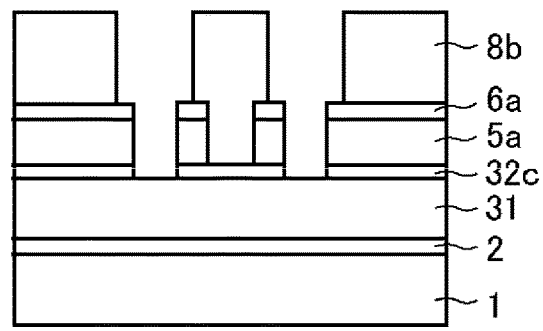
Figure 6F:
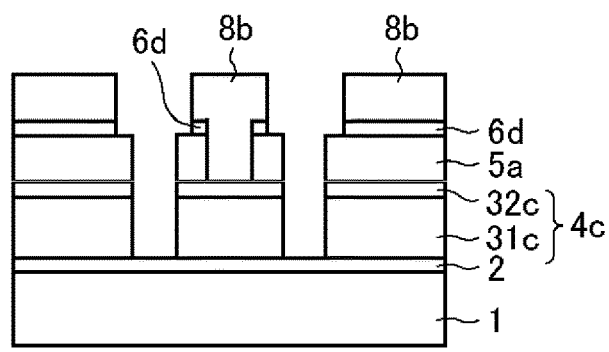
Figure 6G:
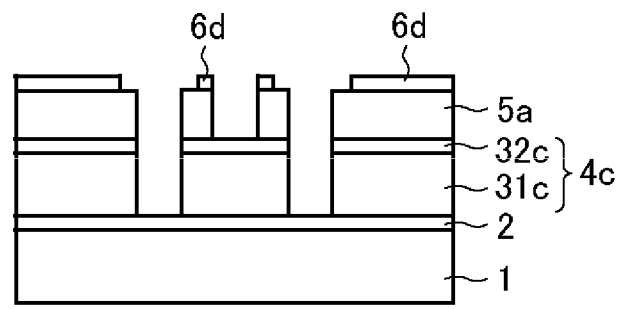

In Example 6, formation of the upper layer pattern 32c was performed by dry etching using a mixed gas containing boron chloride ($BCl_3$) and chlorine ($Cl_2$) and using the second resist pattern 8b and the hard mask pattern 6a as the mask (see FIG. 6E).

Figure 6H:
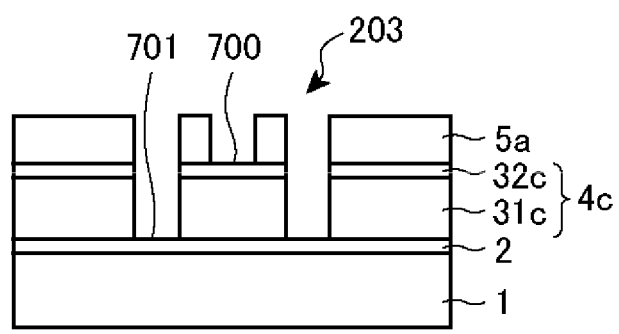

Removal of the hard mask pattern 6d was performed by dry etching using a fluorine-based gas ($CF_4$) (see FIG. 6H). All other steps conformed to the process of Example 1.

The phase shift mask 203 fabricated by Example 6 was formed with an etching stopper film 2 made of an AlSiO film on the transparent substrate 1, and therefore similar effects to the phase shift mask 201 of Example 1 were exhibited. Furthermore, the upper layer 32 also has sufficient etching stopper function for etching with a fluorine-based gas, and therefore almost no etching occurred and surface roughness did not occur when dry etching was performed to remove the hard mask pattern 6d. Therefore, the phase shift pattern 4c that includes the lower layer pattern 31c and the upper layer pattern 32c was a phase shift pattern with extremely high accuracy that provides a predetermined phase difference to the exposure light (ArF Excimer laser light).

The phase shift mask 203 of Example 6 was configured of materials that have sufficient resistance to washing chemicals, and therefore has sufficient chemical washing resistance, and problems with pattern peeling or the like were not observed accompanied by chemical washing. For confirmation, when simulation of an exposure light transfer image using the phase shift mask was performed using AIMS 193, the design specification was sufficiently satisfied, including the areas where EB defect repair was performed.

Example 7

[Manufacture of Mask Blank]

The mask blank 103 of Example 7 is an example corresponding to Embodiment 4, and has a structure of the mask blank where the transparent substrate 1, etching stopper film 2, lower layer 31, upper layer 32, and the light shielding film 5 are laminated in this order. Furthermore, a hard mask film 6 made of CrN similar to Example 5 was formed on the light shielding film 5. The material and manufacturing method of the transparent substrate 1, lower layer 31, upper layer 32, and light shielding film 5, which are the component members, were the same as in Example 5. The upper layer 32 is a film with an etching stopper function toward fluorine-based gas and is made of AlSiO with the composition ratio such that Al:Si:O=21:19:60 (atom % ratio). The upper layer 32 forms the phase shift film 4 of the laminate structure that inverts the phase of the exposure light together with the lower layer 31.

[Manufacture and Evaluation of Phase Shift Mask]

Next, phase shift mask 203 of Example 7 was fabricated using mask blank 103 of Example 7 by procedures similar to those of Example 5. The points that differ from Example 5 with regard to the manufacturing process are only the processes related to the upper layer 32, and therefore the explanation will focus on these points.

In Example 7, a light shielding pattern 5a was formed on the light shielding film 5 by performing dry etching with a fluorine-based gas (a mixed gas containing $SF_6$ and He) using the hard mask pattern 6a as a mask (see FIG. 6C). Note that this dry etching with a fluorine-based gas was carried out under so-called high bias conditions with a bias power of 10 W applied. With the light shielding pattern 5a formed on the upper layer 32, the upper layer 32 sufficiently functions as an etching stopper, so sufficient over etching can be performed as necessary during film forming of the light shielding pattern 5a, and thus the pattern will have high in-plane CD in a vertical cross-section shape. Furthermore, during etching, the exposed surface 700 of the upper layer 32 will undergo essentially no etching, and thus can maintain a high level of phase control as a phase shift film.

Formation of the upper layer pattern 32c was performed by dry etching using a mixed gas containing boron chloride ($BCl_3$) and chlorine ($Cl_2$) and using the second resist pattern 8b and the hard mask pattern 6a as the mask, similarly to Example 6 (see FIG. 6E).

The phase shift mask 203 fabricated by Example 7 was formed with an etching stopper film 2 made of an AlSiO film on the transparent substrate 1, and therefore the effect was similar to those of the phase shift mask 201 of Example 1. Furthermore, the upper layer 32 also has sufficient etching stopper function for etching with a fluorine-based gas, and therefore almost no etching occurred and surface roughness did not occur when dry etching was performed during formation of the light shielding pattern 5a. Therefore, the lower layer pattern 31c and the upper layer pattern 32c are phase shift patterns with extremely high accuracy that provide a predetermined phase difference to the exposure light (ArF Excimer laser light). Furthermore, the light shielding pattern 5a has high in-plane CD uniformity, and the cross-section sidewall shape is favorable and nearly vertical.

Furthermore, the phase shift mask 203 of Example 7 was made of materials that have sufficient resistance to washing chemicals, and therefore has sufficient chemical washing resistance, and problems with pattern peeling or the like were not observed during chemical washing. For confirmation, when simulation of an exposure light transfer image using the phase shift mask was performed using AIMS 193, the design specification was sufficiently satisfied, including the areas where EB defect repair was performed.

Comparative Example 1

[Manufacture of Mask Blank]

The mask blank of Comparative Example 1 has a configuration similar to the mask blank of Example 1 except that etching stopper film was formed from a material containing aluminum and oxygen. The etching stopper film of Comparative Example 1 is an AlO film made of aluminum and oxygen formed to a thickness of 10 nm in contact with the surface of the transparent substrate 1. Specifically, transparent substrate 1 was placed in a single-wafer RF sputtering device and etching stopper film was formed by RF sputtering in which an $Al_2O_3$ target was used and argon gas was used serving as the sputtering gas. X-ray photoelectron spectroscopy analysis of an etching stopper film formed on another transparent substrate under the same conditions found that Al:O=42:58 (atom % ratio). Accordingly, Si/[Si+Al] for the etching stopper film is 0. When the optical coefficient of the etching stopper film was measured using a spectroscopic ellipsometer, the refractive index n was 1.864 and the extinction coefficient k was 0.0689 for light with a wavelength of 193 nm.

When the transmittance of the etching stopper film was measured at the wavelength of an ArF excimer laser (193 nm) by a method similar to that of Example 1, the transmittance was 91.7%, assuming the transmittance of the transparent substrate 1 was 100%, and the effect on the reduction of transmittance due to providing the etching stopper film of Comparative Example 1 was found to be relatively large. The etching rate of the transparent substrate on which an etching stopper film was formed was measured immersing it in ammonia water having a concentration of 0.5%, which was 4.0 nm/min. These results show that the etching stopper film of Comparison Example 1 does not have sufficient resistance to chemical cleaning performed during the process of manufacturing phase shift masks from mask blanks.

Furthermore, the etching selective ratio of the etching stopper film of Comparative Example 1 was evaluated with regard to the etching rate of the phase shift film during dry etching using a $CF_4$ etching gas by the same method as Example 1, and was found to be 0.015, and thus the etching stopper film of Comparative Example 1 had sufficiently high etching stopper function.

[Manufacture and Evaluation of Phase Shift Mask]

Next, a phase shift mask of Comparison Example 1 was fabricated using the mask blank of Comparative Example 1 by procedures similar to those of Example 1. The Levenson phase shift mask of Comparative Example 1 that was fabricated was inspected with regards to mask pattern by a mask inspection device, which detected many defects other than programmed defects. Investigation of each defect portion revealed that most defects were due to the fall out of the phase shift pattern. Note that upon performing EB defect repair using an electron beam and $XeF_2$ gas with respect to defect part at locations in which programmed defects had been arranged, etching endpoints were easily detected and etching in the surface of etching stopper film was minimized.

A phase shift mask was manufactured by similar procedures using another mask blank. With respect to locations in which the phase shift pattern had not dropped out, STEM observation of a cross section of the phase shift pattern confirmed that the etching stopper film of light transmissive portions had disappeared (dissolved due to chemical cleaning) and even at the etching stopper film directly underneath the regions in which the phase shift pattern existed, dissolution was under way from the side wall side to the inner side of the phase shift pattern. From these results, it is conjectured that dissolution of the etching stopper film by chemical cleaning had been the factor causing many dropouts of the phase shift pattern.

With respect to the Levenson type phase shift mask of Comparative Example 1 on which EB defect repair was performed, a simulation of transfer images transferred by exposure to a resist film on a semiconductor device with an exposure light having a wavelength of 193 nm was performed using AIMS 193 (available from Carl Zeiss). Verification of the images transferred by exposure in this simulation revealed that the design specifications fail to be satisfied. Many locations were found in which normal exposure transfer could not be carried out due to the fall out of phase shift pattern. Furthermore, even at locations in which phase shift pattern itself had been accurately formed, a decrease in terms of the accuracy of transferred images seemingly due to the low transmittance of etching stopper film with respect to the ArF Excimer laser light was observed. From these results, it is expected that regardless of the presence/absence of EB defect repairs, in a case where the phase shift mask of Comparison Example 1 is placed in the mask stage of the exposure apparatus and transferred by exposure to a resist film on a semiconductor device, the circuit pattern finally formed on the semiconductor device will suffer many disconnections and short circuits.

DESCRIPTION OF REFERENCE NUMERALS

1: Transparent substrate
2: Etching stopper film
3: Phase shift film
3c, 3e: Phase shift pattern
4: Phase shift film
4c: Phase shift pattern
5: Light shielding film
5a, 5f: Light shielding pattern
6, 9: Hard mask film
6a, 6d, 6f, 9e, 9f: Hard mask pattern
7a: Resist pattern
8b: Resist pattern
31: Lower layer
31c: Lower layer pattern
32: Upper layer (Etching stopper film)
32c: Upper layer pattern (Etching stopper pattern)
101, 103, 105: Mask blank
201, 203, 205: Phase shift mask
700: Phase shift film surface
701: Phase shift pattern opening part surface
702: Dug part
900: Pattern forming region
901: Light shielding band forming region

What is claimed is:

1. A mask blank comprising:
a transparent substrate;
an etching stopper film on a main surface of the transparent substrate;
a phase shift film on the etching stopper film; and
a light shielding film on the phase shift film;
wherein the phase shift film contains silicon and oxygen, and
wherein the etching stopper film contains silicon, aluminum, and oxygen,
wherein a refractive index n of the etching stopper film at wavelength of an exposure light of an ArF excimer laser is 1.57 or more and 1.625 or less, and
wherein a thickness of the etching stopper film is 15 nm or less;
wherein an oxygen content of the etching stopper film 60 atom % or more and 66 atom % or less, and wherein the oxygen content of the etching stopper film is less than a stoichiometric stable oxygen content of the etching stopper film that is calculated from a silicon content and an aluminum content in the etching stopper film.

2. The mask blank according to claim 1, wherein a ratio of a content of the silicon to a total content of the silicon and the aluminum in the etching stopper film is four-fifths or less in terms of atom %.

3. The mask blank according to claim 1, wherein the etching stopper film consists essentially of silicon, aluminum, and oxygen.

4. The mask blank according to claim 1, wherein the etching stopper film is formed in contact with the main surface of the transparent substrate.

5. The mask blank according to claim 1, wherein the thickness of the etching stopper film is 3 nm or more.

6. The mask blank according to claim 1, wherein the phase shift film has a structure comprising a lower layer containing silicon and oxygen and an upper layer containing silicon, aluminum, and oxygen laminated in this order.

7. The mask blank according to claim 1, wherein the phase shift film is configured to generate a phase difference of 150 degrees or more and 200 degrees or less to the exposure light transmitted through the phase shift film as compared to the exposure light that passes through air for a distance identical to a thickness of the phase shift film.

8. The mask blank according to claim 1, wherein the phase shift film is configured to transmit exposure light at a transmissivity of 95% or more.

9. The mask blank according to claim 1, wherein the light shielding film contains chromium.

10. The mask blank according to claim 9, wherein a hard mask film containing at least one element selected from silicon and tantalum is provided on the light shielding film.

11. The mask blank according to claim 1, wherein the light shielding film contains at least one element selected from silicon and tantalum.

12. The mask blank according to claim 11, wherein a hard mask film containing chromium is provided on the light shielding film.

13. A phase shift mask comprising the phase shift film of the mask blank according to claim 1 having a phase shift pattern, and the light shielding film having a light shielding pattern.

14. A method for manufacturing a semiconductor device, comprising transferring by exposure a pattern on a phase shift mask to a resist film on a semiconductor substrate using the phase shift mask according to claim 13.

15. A method for manufacturing a phase shift mask using the mask blank according to claim 1, comprising:

forming a phase shift pattern in the light shielding film by a first dry etching;

forming the phase shift pattern in the phase shift film by a second dry etching with a fluorine-based gas, using the light shielding film having the phase shift pattern as a mask; and forming a light shielding pattern including a light shielding band on the light shielding film by a third dry etching.

16. A method for manufacturing a semiconductor device, comprising transferring by exposure a pattern on a phase shift mask to a resist film on a semiconductor substrate using a phase shift mask manufactured by the method for manufacturing a phase shift mask according to claim 15.

17. The mask blank according to claim 1, wherein a thickness of the phase shift film is 143 nm or more.

18. The mask blank according to claim 1, wherein a refractive index n of the phase shift film at wavelength of an exposure light of an ArF excimer laser is 1.52 or more.

19. The mask blank according to claim 1, wherein an extinction coefficient k of the etching stopper film at wavelength of the exposure light is 0.04 or less.

20. The mask blank according to claim 1, wherein the refractive index n of the etching stopper film at wavelength of the exposure light is greater than the refractive index n of the phase shift film at wavelength of the exposure light.

21. The mask blank according to claim 1, wherein a ratio of a content of the silicon to a total content of the silicon and the aluminum in the etching stopper film is one-fifth or more in terms of atom %.

* * * * *